(12) United States Patent
Lee et al.

(10) Patent No.: US 10,754,211 B2
(45) Date of Patent: Aug. 25, 2020

(54) DISPLAY DEVICE AND MANUFACTURING METHOD THEREOF

(71) Applicant: Samsung Display Co., Ltd., Yongin-si, Gyeonggi-do (KR)

(72) Inventors: Sang Hwan Lee, Asan-si (KR); Ju Hyun Shin, Hwaseong-si (KR); Seong Hyun Go, Yongin-si (KR); Jong Chul Choi, Icheon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/693,157

(22) Filed: Aug. 31, 2017

(65) Prior Publication Data

US 2018/0081225 A1 Mar. 22, 2018

(30) Foreign Application Priority Data

Sep. 22, 2016 (KR) .................. 10-2016-0121570

(51) Int. Cl.
*G02F 1/1345* (2006.01)
*G02F 1/13* (2006.01)
(Continued)

(52) U.S. Cl.
CPC ........ *G02F 1/13452* (2013.01); *G02F 1/1309* (2013.01); *G02F 1/13458* (2013.01); *G02F 1/133308* (2013.01); *G02F 1/133512* (2013.01); *G02F 1/133528* (2013.01); *H05K 1/111* (2013.01); *H05K 1/148* (2013.01); *G02F 2001/133314* (2013.01); *G02F 2001/133325* (2013.01); *G02F 2001/133331* (2013.01);
(Continued)

(58) Field of Classification Search
CPC ............... G02F 1/13452; G02F 1/1309; G02F 1/133308; G02F 1/133512; G02F 1/133528; G02F 1/13458; G02F 2001/133314; G02F 2001/133325; G02F 2001/133331; G02F 2001/133388; G02F 2201/503; G02F 2202/023; H05K 1/111; H05K 1/148; H05K 3/361
USPC .......................................................... 361/749
See application file for complete search history.

(56) References Cited

U.S. PATENT DOCUMENTS 8,597,861 B2 12/2013 Kim et al.
2013/0271958 A1 10/2013 Jang et al.
(Continued)

FOREIGN PATENT DOCUMENTS

| KR | 10-2000-0010136 A | 2/2000 |
| KR | 10-2008-0090627 A | 10/2008 |
| KR | 10-2011-0094395 A | 8/2011 |
| WO | 2008-123661 A1 | 10/2008 |

OTHER PUBLICATIONS

European Search Report dated Jan. 23, 2018, EP Application No. EP 17 19 1744, 11 pages.

*Primary Examiner* — Michael P McFadden
(74) *Attorney, Agent, or Firm* — Innovation Counsel LLP

(57) ABSTRACT

A display device includes: a first substrate including a planar display area and a planar non-display area; a pad disposed beneath the first substrate in the non-display area; a target checking portion disposed beneath the first substrate in the non-display area and including at least a part of an area provided with the pad; and a light-blocking pattern disposed in the non-display area on the first substrate to cover the target checking portion and containing a discoloring material.

11 Claims, 23 Drawing Sheets

(51) Int. Cl.
*G02F 1/1333* (2006.01)
*G02F 1/1335* (2006.01)
*H05K 1/11* (2006.01)
*H05K 1/14* (2006.01)
*H05K 1/18* (2006.01)
*H05K 3/36* (2006.01)

(52) U.S. Cl.
CPC ............ *G02F 2001/133388* (2013.01); *G02F 2201/50* (2013.01); *G02F 2201/503* (2013.01); *G02F 2202/023* (2013.01); *H05K 1/147* (2013.01); *H05K 1/189* (2013.01); *H05K 3/361* (2013.01); *H05K 2201/042* (2013.01); *H05K 2201/056* (2013.01); *H05K 2201/10136* (2013.01)

(56) References Cited

U.S. PATENT DOCUMENTS

| | | | | |
|---|---|---|---|---|
| 2015/0226391 | A1* | 8/2015 | Sellam | F21V 19/003 362/249.02 |
| 2015/0230337 | A1* | 8/2015 | Kim | H05K 1/189 361/751 |
| 2015/0243933 | A1* | 8/2015 | Lee | H01L 51/5281 257/40 |
| 2015/0253613 | A1* | 9/2015 | Yoon | G02F 1/13452 349/58 |
| 2016/0195709 | A1* | 7/2016 | Kinoshita | G02F 1/17 359/290 |
| 2016/0334656 | A1* | 11/2016 | Senokuchi | G02F 1/1339 |

* cited by examiner

DISPLAY DEVICE AND MANUFACTURING METHOD THEREOF

This application claims priority from Korean Patent Application No. 10-2016-0121570 filed on Sep. 22, 2016 in the Korean Intellectual Property Office, the disclosure of which is incorporated herein by reference in its entirety.

BACKGROUND

1. Field of the Disclosure

The present disclosure relates to a display device and a manufacturing method thereof.

2. Description of the Related Art

Typical examples of display devices may include liquid crystal displays, organic light emitting displays, plasma displays, and electrophoretic displays.

Recently, research into a display device having a narrow bezel structure formed by removing a top cover or chassis covering a part of the upper portion of the display device has been conducted.

However, when light-blocking ink for blocking visible light is applied onto the non-display area of the display device during a display device manufacturing process, it is difficult to reduce the defect rate of the display device because it is substantially impossible to check or inspect a portion covered with the light-blocking ink in the subsequent steps.

SUMMARY

An aspect of the inventive concept is to provide a display device including a light-blocking pattern for preventing the light transmission to the non-display area of the display device, and a manufacturing method thereof.

Another aspect of the inventive concept is to provide a display device which can reduce the defect rate of the display device by checking or inspecting the components provided under the display device, and a manufacturing method thereof.

According to an exemplary embodiment, there is provided a display device. The display device comprises: a first substrate including a planar display area and a planar non-display area; a pad disposed beneath the first substrate in the non-display area; a target checking portion disposed beneath the first substrate in the non-display area and including at least a part of an area provided with the pad; and a light-blocking pattern disposed in the non-display area on the first substrate to cover the target checking portion and containing a discoloring material.

According to another exemplary embodiment, there is provided a display device. The display device comprises: a first substrate provided with a pad disposed beneath the first substrate; a flexible printed circuit board provided with a bump connected with the pad; and a light-blocking pattern disposed on the first substrate to cover the pad and the bump and containing a discoloring material.

According to an exemplary embodiment, there is provided a method of manufacturing a display device. The method of manufacturing the display device comprises: forming a first substrate including a pad disposed beneath the first substrate; forming a light-transmitting pattern containing a discoloring material on the first substrate to cover the pad; connecting the pad with a bump disposed on a flexible printed circuit board; and discoloring the light-transmitting pattern.

However, aspects of the inventive concept are not restricted to the one set forth herein. The above and other aspects of the inventive concept will become more apparent to one of ordinary skill in the art to which the inventive concept pertains by referencing the detailed description given below.

BRIEF DESCRIPTION OF THE DRAWINGS

The above and other aspects and features of the inventive concept will become more apparent by describing in detail exemplary embodiments thereof with reference to the attached drawings, in which.

DETAILED DESCRIPTION OF THE EMBODIMENTS

Figure 1:
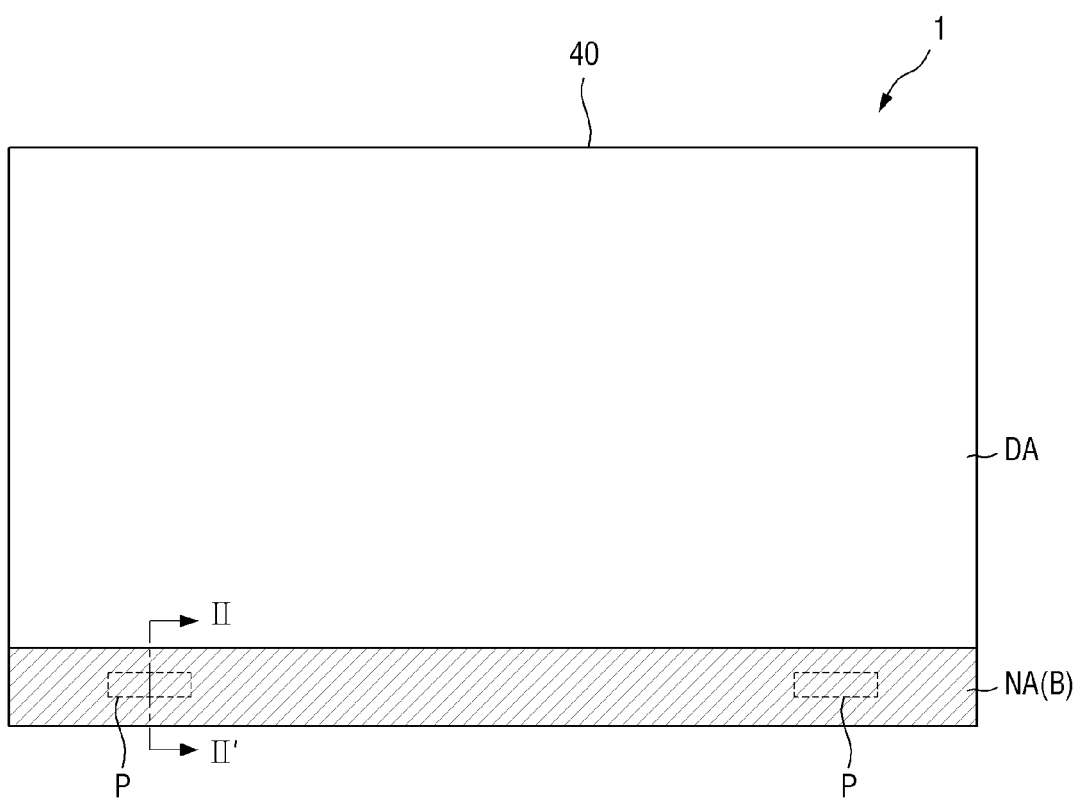
FIG. 1 is a plan view of a display device according to an embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other.

Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof. "At least one" is not to be construed as limiting "a" or "an." "Or" means "and/or." As used herein, the term "and/or" includes any and all combinations of one or more of the associated listed items.

Hereinafter, embodiments will be described in detail with reference to the attached drawings.

Each of the display devices according to embodiments may be a light-receiving display device, such as a liquid crystal display device or an electrophoretic display device, or a self light-emitting display device, such as an organic light-emitting display device or a plasma display device. Hereinafter, a case of a display device having a narrow bezel structure formed by removing a top cover or chassis covering a part of the upper portion of the display device will be described, but the embodiments are not limited thereto.

FIG. 1 is a plan view of a display device 1 according to an embodiment.

Referring to FIG. 1, the display device 1 includes a display panel 40 for displaying an image. The display panel 40 may include a planar display area DA and a planar non-display area NA. The display area DA is an area where an image is viewed, and the non-display area NA is an area where the image is not viewed. The non-display area NA may be formed along the outside of the display area DA. In an embodiment, the display panel 40 has a rectangular shape having a pair of long sides and a pair of short sides, and the non-display area NA may be disposed along one long side of the display panel 40.

The display area DA may include a plurality of pixels (not shown). The plurality of pixels may be arranged in a matrix shape. A signal wiring for driving each pixel, for example, a gate line (not shown) and a data line (not shown), may be disposed at the boundary of each pixel.

A portion where an external drive element, such as a drive chip or a printed circuit board, is connected may be disposed in the non-display area NA of the display panel 40. Such an external drive element connection portion may be a target checking portion P, as will described later. The target checking portion P may include indent marks or align marks of the aforementioned external drive element connection portion.

The non-display area NA may be provided with a light-blocking pattern B. The light-blocking pattern B may be disposed to overlap the same area as the non-display area NA. The light-blocking pattern B may be made of a material performing a light-transmitting or light-blocking function according to an external stimulus. The light-blocking pattern B may be disposed to partially or entirely cover the upper surface of the target checking portion P.

Since the light-blocking pattern B is transparent at the time of checking the target checking portion P, the state under the light-blocking pattern B may be checked with naked eyes. However, since this light-blocking pattern B is then discolored, the light-blocking pattern B may block light such that the state under the light-blocking pattern B is not seen. The checking of the target checking portion P is performed during a manufacturing process or after partially completing the manufacturing process. In a state in which the light-blocking pattern B is discolored, the target checking portion P may not be viewed from the outside. A detailed description of the light-blocking pattern B will be described later.

Hereinafter, the internal structure of the display device 1 will be described in detail with reference to FIG. 2.

Figure 2:
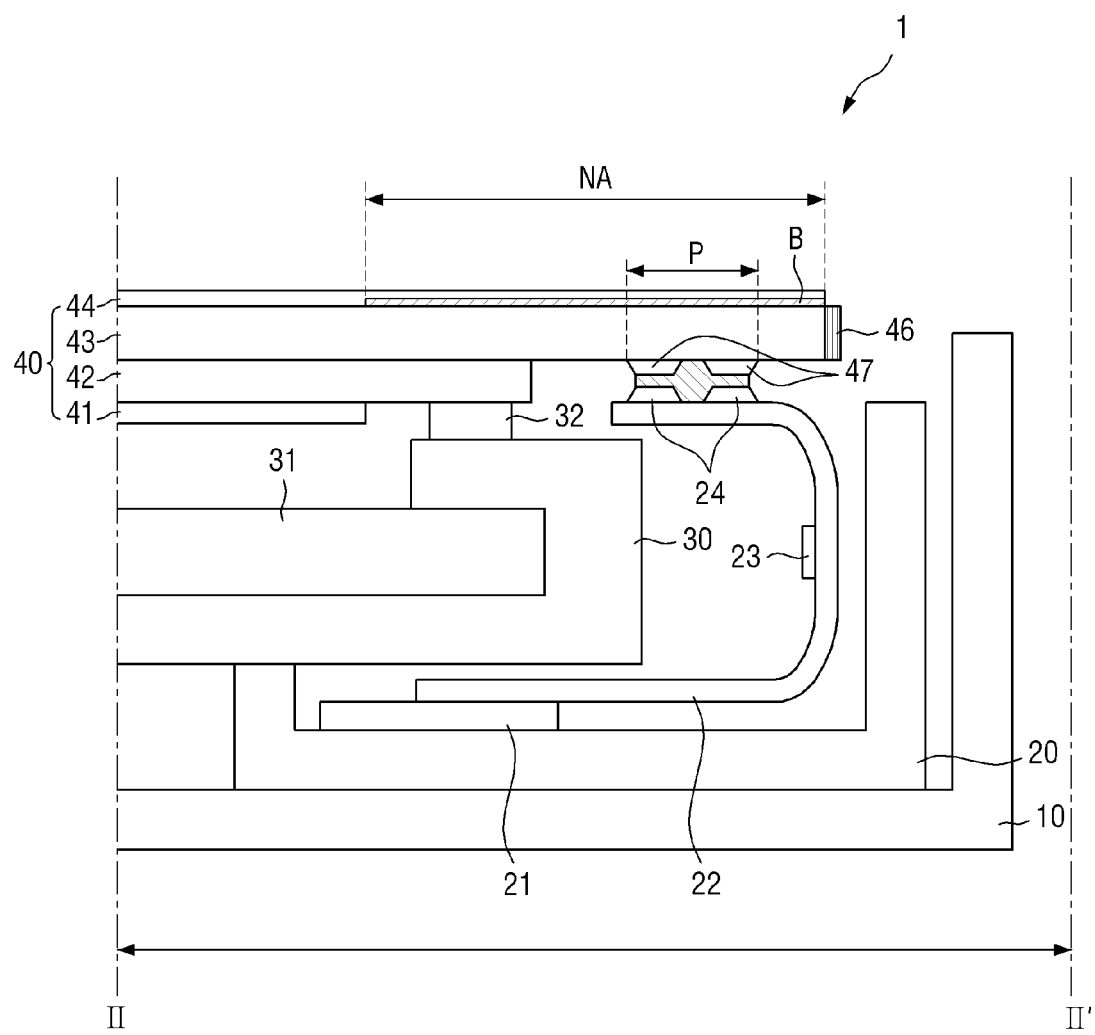
FIG. 2 is a cross-sectional view taken along the line II-II' of FIG. 1.

FIG. 2 is a cross-sectional view taken along the line II-II' of FIG. 1.

The display device 1 includes a rear cover 10, an auxiliary cover 20, a backlight unit 31, a mold 30, and the display panel 40.

The rear cover 10 may be disposed at the lowermost portion of the display device 1. The rear cover 10 may have a plate shape to store the components constituting the display device 1.

The auxiliary cover 20 may be disposed on the rear cover 10. The auxiliary cover 20 may have a plate shape to store a printed circuit board (PCB) 21, and a part of the auxiliary cover 20 may protrude upward to support the components disposed thereon.

The mold 30 may be disposed on the auxiliary cover 20. The mold 30 may store the backlight unit 31 and support the display panel 40 disposed thereon.

The backlight unit 31 may be disposed to provide light to the display panel 40, and may include a light source, such as a light emitting diode (LED), a light guide plate, and an optical sheet.

The display panel 40 may be disposed on the mold 30. The display panel 40 may be attached and fixed to the mold 30 by an adhesive member 32, such as an adhesive tape.

The display panel 40 may include a first substrate 43, a second substrate 42, a first polarizing unit 41, a second polarizing unit 44, and the light-blocking pattern B, and a bumper 46.

Although not shown in the drawings, the first substrate 43 may be a thin film transistor substrate where a gate wiring, an active layer, and a data wiring are laminated on a base substrate.

A pad 47 may be disposed in the planar non-display area NA of the first substrate 43. The pad 47 may include a gate pad and/or a data pad connected with the ends of a gate wiring and/or a data wiring extending to the non-display area NA.

The first substrate 43 may be disposed such that the rear surface of the base substrate faces toward the upper portion of the display device 1. Thus, the first substrate 43 may be disposed such that the pad 47 of the first substrate 43 faces toward the lower portion of the display device 1.

The pad 47 may be connected with a part of a flexible printed circuit board (FPCB) 22. The flexible printed circuit board 22, which is a printed circuit board mounted with an integrated circuit (IC) chip 23, may include a flexible material, and may be disposed in the display device 1 in a bent state.

In an exemplary embodiment, the pad 47 may be connected with a bump 24 formed on a part of the flexible printed circuit board 22 by an anisotropic conductive film (ACF). Specifically, the anisotropic conductive film is disposed between the pad 47 and the bump 24 and then thermally pressed to physically connect the pad 47 and the bump 24, and the pad 47 and the bump 24 are electrically connected by conductive particles contained in the anisotropic conductive film. As the thermal pressing, outer lead bonding (OLB) may be used, but the embodiments are not limited thereto. As described above, the indent marks resulting from the thermal pressing may be one of the target checking portions P.

The flexible printed circuit board 22 is bent toward the inside of the display device 1, and the other portion of the flexible printed circuit board 22 may be connected with the printed circuit board 21 stored in the auxiliary cover 20. The printed circuit board 21 may apply an image signal to the display panel 40 through the flexible printed circuit board 22.

The second substrate 42 may be disposed beneath the first substrate 43 to face the first substrate 43. The second substrate 42 may include a common electrode, a color filter, and the like.

One side of the second substrate 42 may be shorter than one side of the first substrate 43 so as to expose an area where the pad 47 of the first substrate 43 is connected with the flexible printed circuit board 22.

A liquid crystal layer (not shown) and a sealing material (not shown) surrounding the lateral side of the liquid crystal layer to seal the liquid crystal layer may be disposed between the first substrate 43 and the second substrate 42.

The first polarizing unit 41 may be disposed beneath the second substrate 42. The first polarizing unit 41 may be disposed beneath only a part of the second substrate 42 to correspond to the planar display area DA. In this case, the adhesive member 32 for attaching the second substrate 42 to the mold 30 may be disposed in an area of the second substrate 42 where the first polarizing unit 41 is not disposed. However, the embodiments are not limited thereto, and the first polarizing unit 41 may also be disposed in the second substrate 42 in the form of a wire grid or the like.

The light-blocking pattern B may be disposed in the non-display area NA on the first substrate 43. The light-blocking pattern B may be disposed to overlap the same area as the non-display area NA. The light-blocking pattern B may be disposed on the rear surface of the base substrate of the first substrate 43 by coating, but the embodiments are not limited thereto. As another example, the light-blocking pattern B may be disposed on the upper surface of the first substrate 43 or inside the first substrate 43. In other words, the light-blocking pattern B may be disposed on an insulation film or conductive film formed on the base substrate. The light-blocking pattern B may be formed by coating or deposition.

The light-blocking pattern B may be disposed to cover a part of the target checking portion P or the entire target checking portion P. It is exemplified in the drawings that the target checking portion P is a portion where the pad 47 and the flexible printed circuit board 22 are connected with each other. In this embodiment, the light-blocking pattern B may be disposed to completely cover the portion where the pad 47 and the flexible printed circuit board 22 are connected with each other.

The light-blocking pattern B may contain a discoloring material which is changed by physical or chemical stimulation to be discolored while maintaining a light-transmitting state.

The discoloring material may be a material, such as pigment, paint, dye, or ink, which is physically or chemically changed by the stimulation of light, heat, moisture, a chemical material, or physical external force.

In an exemplary embodiment, the discoloring material may transmit light having a specific wavelength (infrared light, visible light or the like) before receiving specific stimulation and may absorb or reflect the light when receiving the specific stimulation.

Moreover, the discoloring material may be an irreversible discoloring material which is not recovered to the color before discoloration when color is changed by the specific stimulation.

In an exemplary embodiment, the discoloring material is transparent to visible light before ultraviolet (UV) irradiation, and may be irreversibly changed into a color for substantially blocking visible light when ultraviolet light is applied. Specifically, the discoloring material may contain a photosensitive material and a photoinitiator.

The photosensitive material may contain one or more selected from the group consisting of spiropyrans, spirooxazines, naphthopyrans, bismethyl phenyl diphenyl butatriene, trinitrofluorenone, and derivatives thereof.

In an exemplary embodiment, the spiropyrans may include, but are not limited to, one or more selected from 1',3'-dihydro-1',3',3'-trimethyl-6-nitrospiro[2H-1-benzopyran-2,2'-(2H)-indole], 1',3'-dihydro-8-methoxy-1',3',3'-trimethyl-6-nitrospiro[2H-1-benzopyran-2,2'-(2H)-indole], 6,8-dibromo-1',3'-dihydro-1',3',3'-trimethylspiro[2H-1-benzopyran-2,2'-(2H)-indole], 6-bromo-1',3'-dihydro-1',3',3'-trimethyl-8-nitrospiro[2H-1-benzopyran-2,2'-(2H)-indole], and 1',3'-dihydro-5'-methoxy-1',3',3'-trimethyl-6-nitrospiro[2H-1-benzopyran-2,2'-(2H)-indole].

In an exemplary embodiment, the spirooxazines may include, but are not limited to, one or more selected from 1,3-dihydro-1,3,3-trimethylspiro[2H-indole-2,3'-[3H]naphth[2,1-b][1,4]oxazine], 5-chloro-1,3-dihydro-1,3,3-trimethyl spiro[2H-indole-2,2'-[2H]phenanthro[9,10-b](1,4)oxazine], 5-chloro-1,3-dihydro-1,3,3-trimethylspiro[2H-indole-2,3'-(3H)naphth[2,1-b](1,4)oxazine], and 1,3-dihydro-1,3,3-trimethylspiro[2H-indole-2,3'-[3H]phenanthr[9,10-b](1,4)oxazine].

In an exemplary embodiment, the naphthopyrans may include, but are not limited to, one or more selected from 3-(2,3-dihydrobenzofuran-5-yl)-3-phenyl-3H-naphtho-[2,1-b]-pyran, 3-(4-methoxyphenyl)-3-(2,4,7-tri-methyldihydrobenzofuran-5-yl)-3H-naphtho-[2,1-b]-pyran, 3-(2,3-dihydrobenzofuran-5-yl)-3-(2-methoxyphenyl)-3H-naphtho-[2,1-b]-pyran, 8-methoxy-3-(2,3-dihydrobenzofuran-5-yl)-3-(2-fluorophenyl)-3H-naphtho-[2,1-b]-pyran, 5-acetoxy-3-(2,3-dihydrobenzofuran-5-yl)-3-(2-fluorophenyl)-3H-naphtho-[2,1-b]-pyran, and 3-(2,3-dihydrobenzofuran-5-yl)-3-(2-fluorophenyl)-3H-naphtho-[2,1-b]-pyran.

The photoinitiator may include, but is not limited to, one or more selected from alpha-hydroxyketone, mono- or bisa-cylphosphine oxide, benzophenone, thioxanthone, ketosulfone, benzyl ketal, phenylglyoxylate, borate, titanocene, and oxime ester.

When the discoloring material contains the photosensitive material and the photoinitiator, the light-blocking pattern B may contain an unreacted photosensitive material and/or a photoinitiator in addition to the material changed by light irradiation.

The second polarizing unit 44 may be disposed on the first substrate 43. The second polarizing unit 44 may be disposed to cover the entire area on the first substrate 43, the entire area including an area where the light-blocking pattern B is formed. The second polarizing unit 44 serves to protect the light-blocking pattern B to prevent the light-blocking pattern B from being damaged by foreign matter or external force. However, the embodiments are not limited thereto, and the second polarizing unit 44 may also be disposed in the first substrate 43 in the form of a wire grid.

The bumper 46 may be disposed to cover at least one lateral side of the first substrate 43. The bumper 46 may contain an elastic material to serve as a buffer for preventing the display panel 40 from being directly in contact with the rear cover 10 or the auxiliary cover 20.

In an exemplary embodiment, the bumper 46 may contain a resin cured by irradiation with light, such as ultraviolet, but the embodiments are not limited thereto.

The bumper 46 may be transparent, or may have a color, such as white, blue, red, or black. The color of the bumper 46 is not limited thereto.

In an exemplary embodiment, the bumper 46 may have a color substantially absorbing or reflecting visible light. Thus, even when the light emitted from the backlight unit 31 is guided to the lateral end of the display panel 40 along the surface of the first substrate 43, a light leakage phenomenon may be suppressed because this light is absorbed in the bumper 46 or is reflected from the bumper 46.

Hereinafter, other embodiments will be described.

Figure 3:
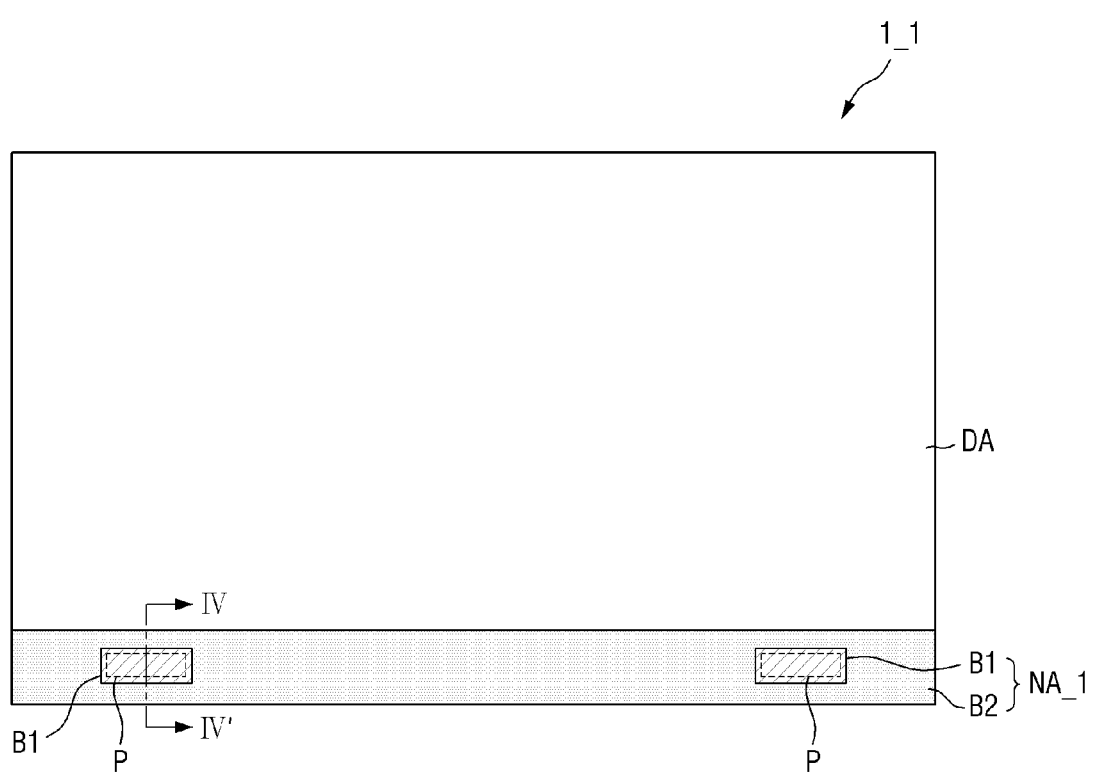
FIG. 3 is a plan view of a display device according to another embodiment.
Figure 4:
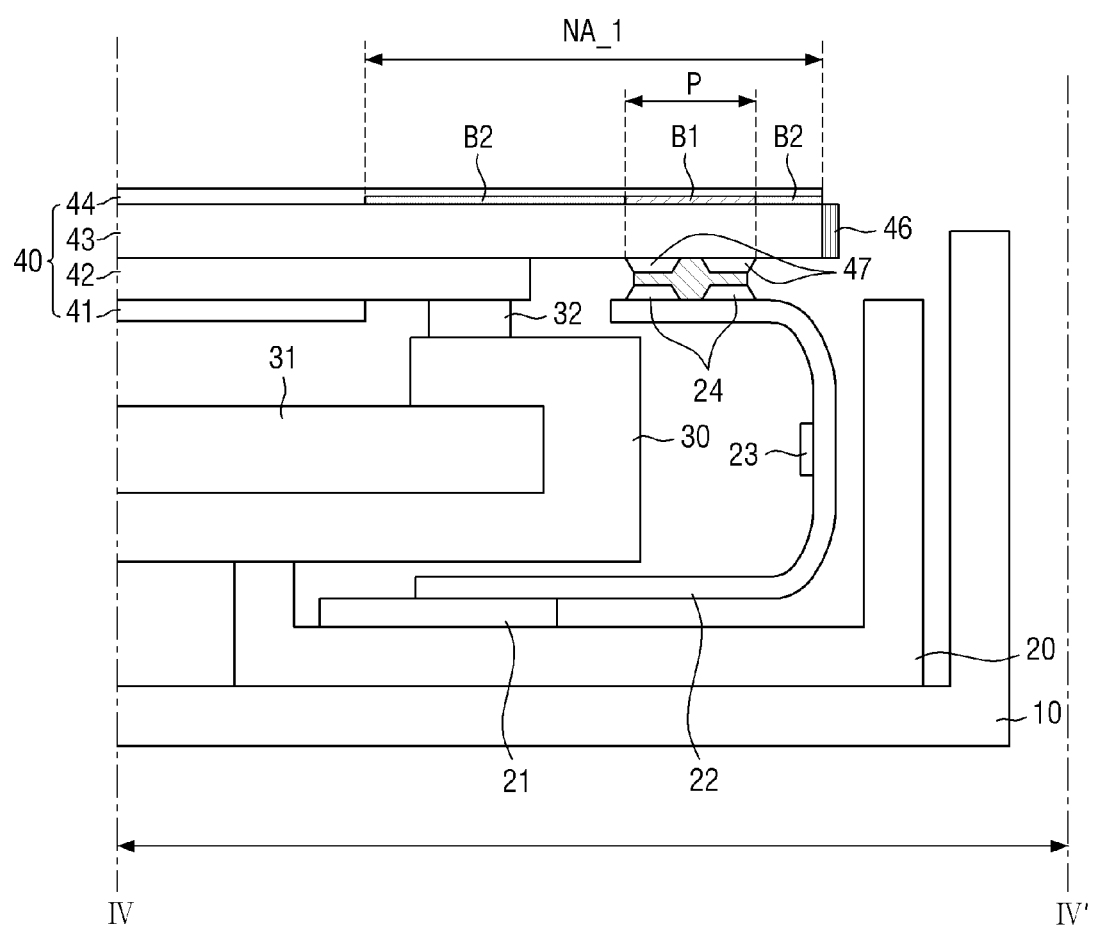
FIG. 4 is a cross-sectional view taken along the line IV-IV' of FIG. 3.

FIG. 3 is a plan view of a display device according to another embodiment, and FIG. 4 is a cross-sectional view taken along the line IV-IV' of FIG. 3.

The display device 1_1 of FIGS. 3 and 4 is the same as the display device 1 having been described with reference to FIGS. 1 and 2, except that the display device 1_1 includes a first light-blocking pattern B1 and a second light-blocking pattern B2. Hereinafter, a duplicated description will be omitted, and differences will be mainly described.

Referring to FIGS. 3 and 4, a non-display area NA_1 may be provided with the first light-blocking pattern B1 and the second light-blocking pattern B2.

The first light-blocking pattern B1 may be disposed to overlap substantially the same area as the target checking portion P. The second light-blocking pattern B2 may be disposed to overlap an area of the non-display area NA_1, in which the first light-blocking pattern B1 is not disposed. The first light-blocking pattern B1 and the second light-blocking pattern B2 may not overlap each other. The second light-blocking pattern B2 may be disposed to cover the remaining area of the non-display area NA_1 except for the portion where the first light-blocking pattern B1 is disposed.

The first light-blocking pattern B1 may contain the material contained in the light-blocking pattern B having been described in FIGS. 1 and 2.

The second light-blocking pattern B2 may contain a material blocking light having a specific wavelength range by absorbing or reflecting the light. In an exemplary embodiment, the second light-blocking pattern B2 may contain pigment, paint, dye, or ink, which has a color for substantially blocking blue, red or black visible light.

The second light-blocking pattern B2 may not contain the aforementioned discoloring material.

In an exemplary embodiment, the first light-blocking pattern B1, which is disposed in only the area covering the target checking portion P, contains the discoloring material, and the second light-blocking pattern B2 contains only general ink having a specific color, thereby reducing the cost taken to use the discoloring material.

As described above, the target checking portion P may be a portion where the pad 47 and the flexible printed circuit board 22 are connected with each other.

FIGS. 5 to 8 are plan views of display devices according to other embodiments.

The display devices 1_2, 1_3, 1_4, and 1_5 of FIGS. 5, 6, 7 and 8, respectively, are the same as the display device 1 having been described with reference to FIGS. 1 and 2, except that the positions where a planar display area and a planar non-display area are disposed are different. Hereinafter, a duplicated description will be omitted, and differences will be mainly described.

Figure 5:
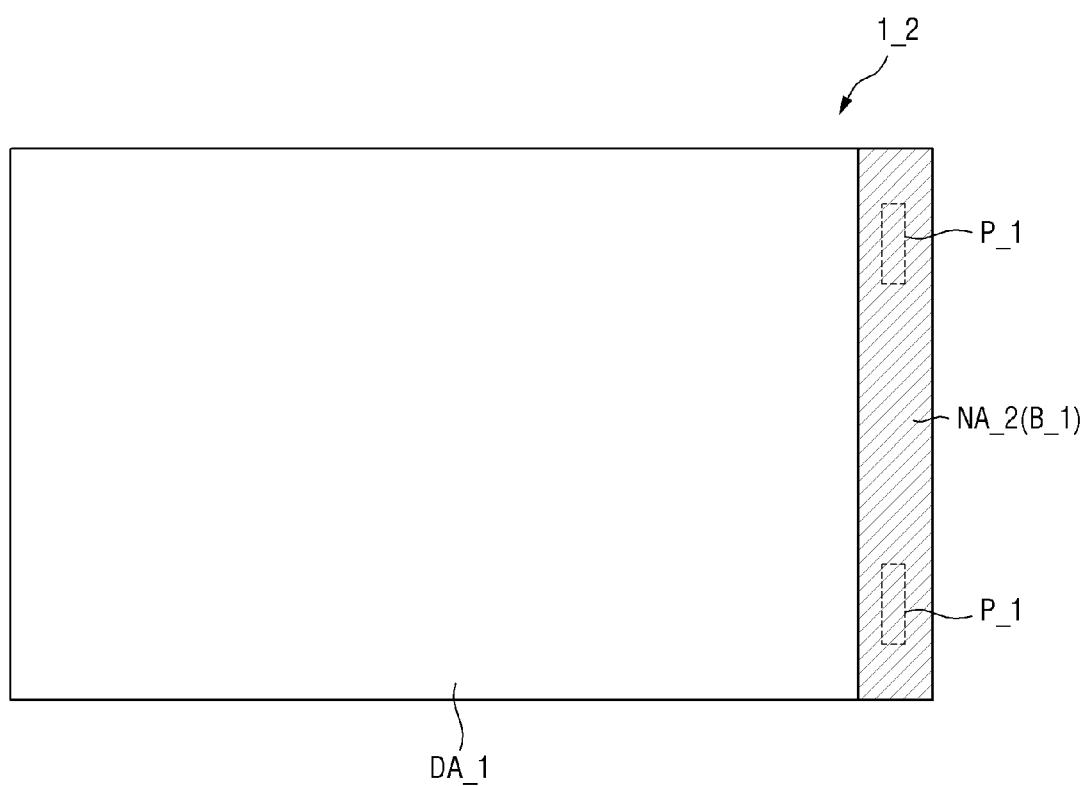
FIGS. 5, 6, 7, and 8 are plan views of display devices according to other embodiments.

Referring to FIG. 5, a non-display area NA_2 may be disposed along one short side of the display device 1_2 among the outer sides of a display area DA_1.

The non-display area NA_2 may be provided therein with at least one target checking portion P_1, and a light-blocking pattern B_1 may be disposed to overlap the same area as the non-display area NA_2. The light-blocking pattern B_1 may be disposed to cover a part of the upper surface of the target checking portion P_1 or the entire upper surface thereof.

Figure 6:
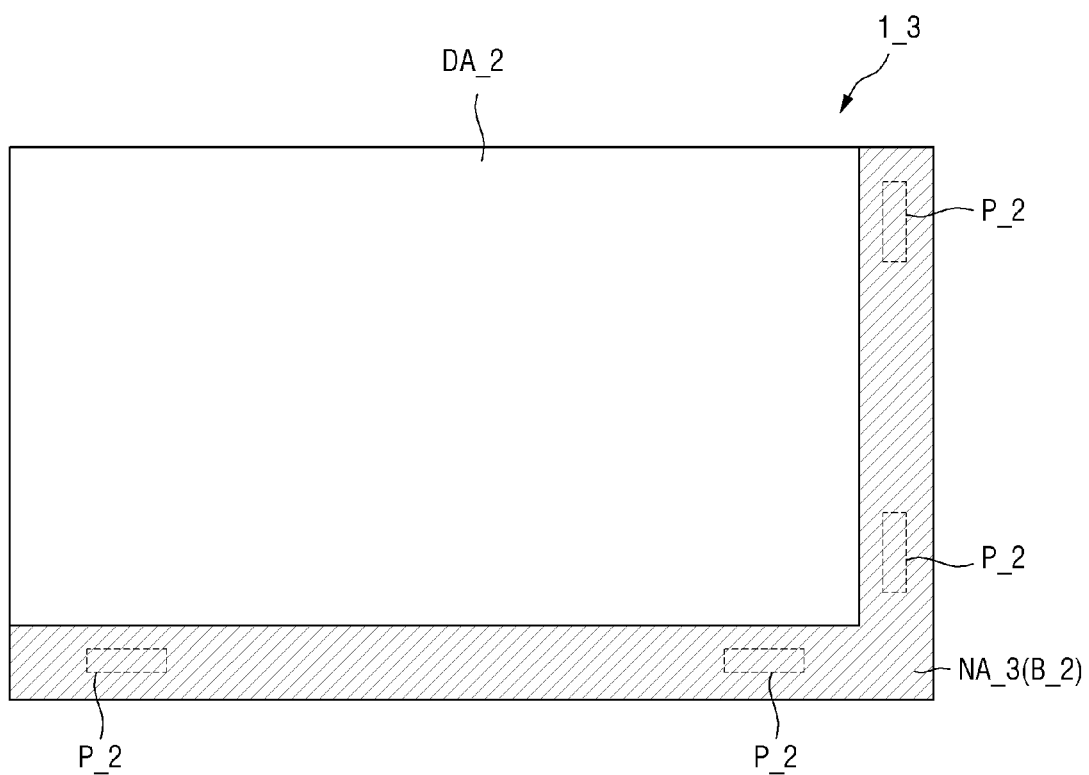

Referring to FIG. 6, a non-display area NA_3 may be disposed along one short side and one long side of the display device 1_3 among the outer sides of a display area DA_2. A portion where one short side and one long side of the non-display area NA_3 meet may have a continuous form connected without a separate boundary.

The non-display area NA_3 of each of one short side and one long side may be provided therein with at least one target checking portion P_2, and a light-blocking pattern B_2 may be disposed to overlap the same area as the non-display area NA_3. The light-blocking pattern B_2 may be disposed to cover a part of the upper surface of the target checking portion P_2 or the entire upper surface thereof.

Figure 7:
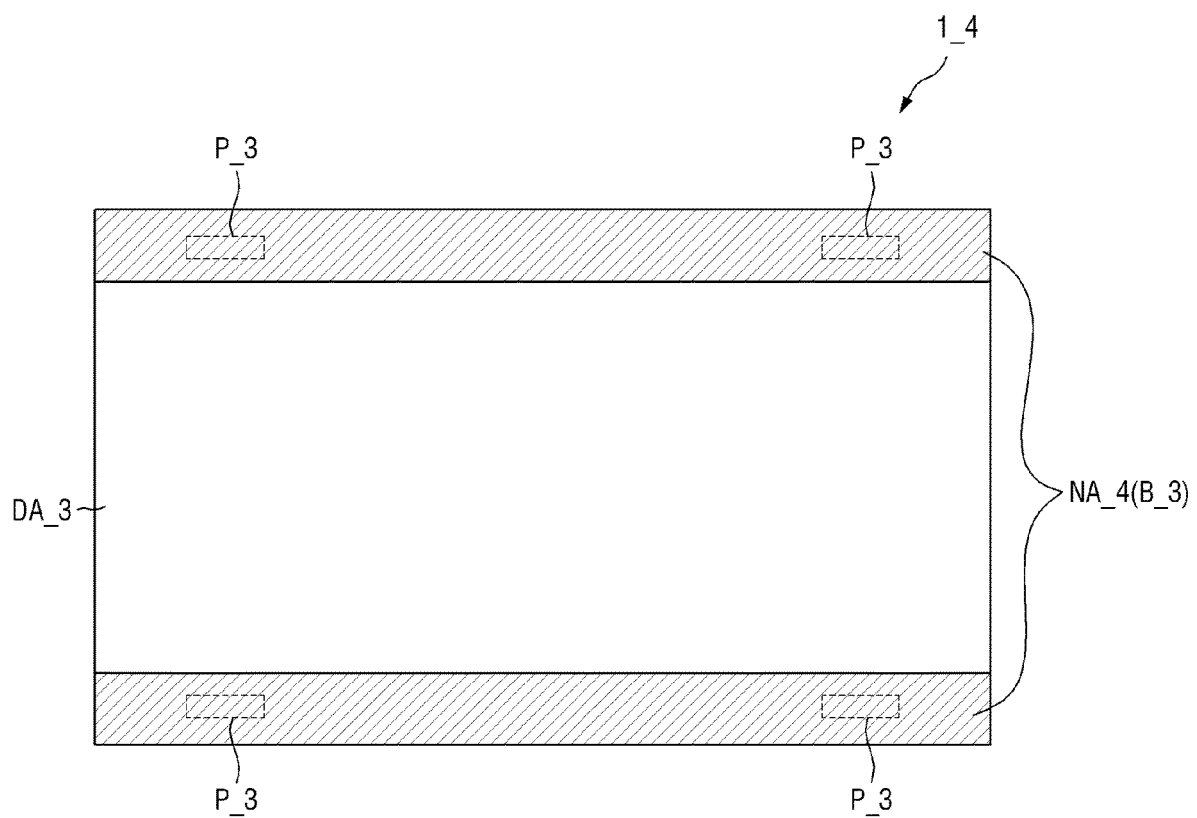

Referring to FIG. 7, non-display areas NA_4 may be disposed along both long side of the display device 1_4 among the outer sides of a display area DA_3.

The non-display area NA_4 of each of both long sides may be provided therein with at least one target checking portion P_3, and a light-blocking pattern B_3 may be disposed to overlap the same area as the non-display area NA_4. The light-blocking pattern B_3 may be disposed to cover a part of the upper surface of the target checking portion P_3 or the entire upper surface thereof.

Figure 8:
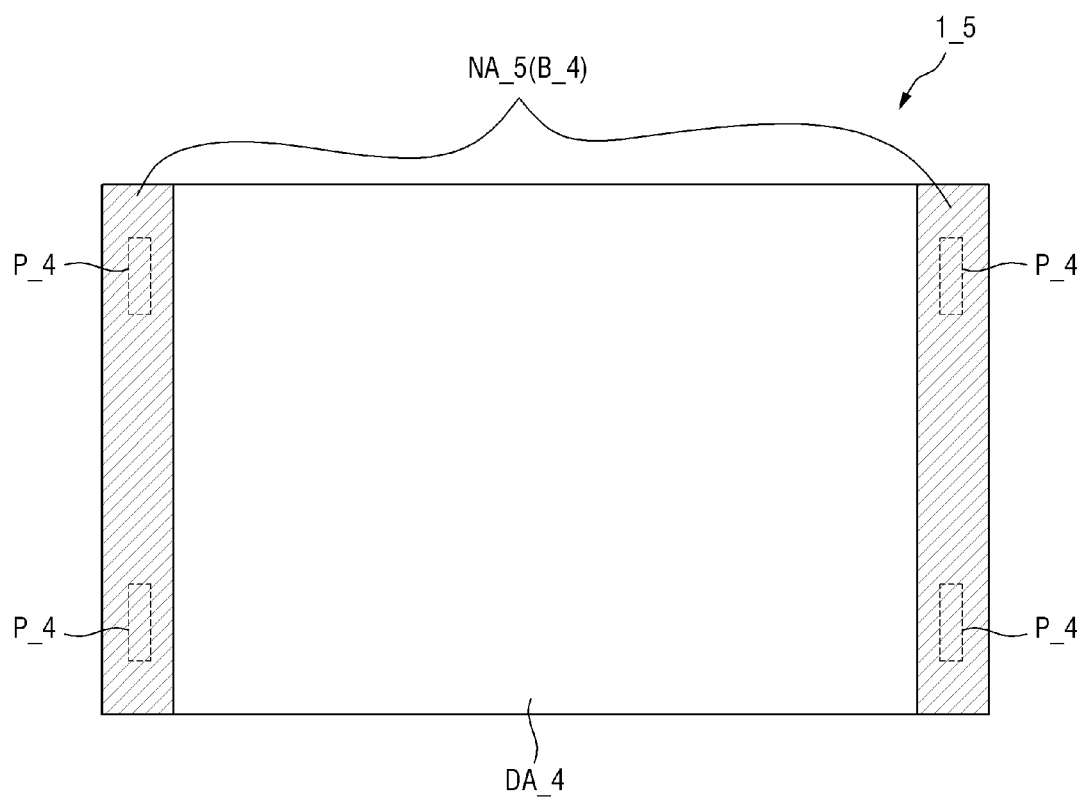

Referring to FIG. 8, non-display areas NA_5 may be disposed along both short side of the display device 1_5 among the outer sides of a display area DA_4.

The non-display area NA_5 of each of both short sides may be provided therein with at least one target checking portion P_4, and a light-blocking pattern B_4 may be disposed to overlap the same area as the non-display area NA_5. The light-blocking pattern B_4 may be disposed to cover a part of the upper surface of the target checking portion P_4 or the entire upper surface thereof.

FIGS. 9 to 12 are cross-sectional views of display devices according to other embodiments.

The display devices 1_6, 1_7, 1_8, and 1_9 of FIGS. 9, 10, 11, and 12, respectively, are the same as the display device 1 having been described with reference to FIGS. 1 and 2, except that members disposed on a light-blocking pattern B are different. Hereinafter, a duplicated description will be omitted, and differences will be mainly described.

Figure 9:
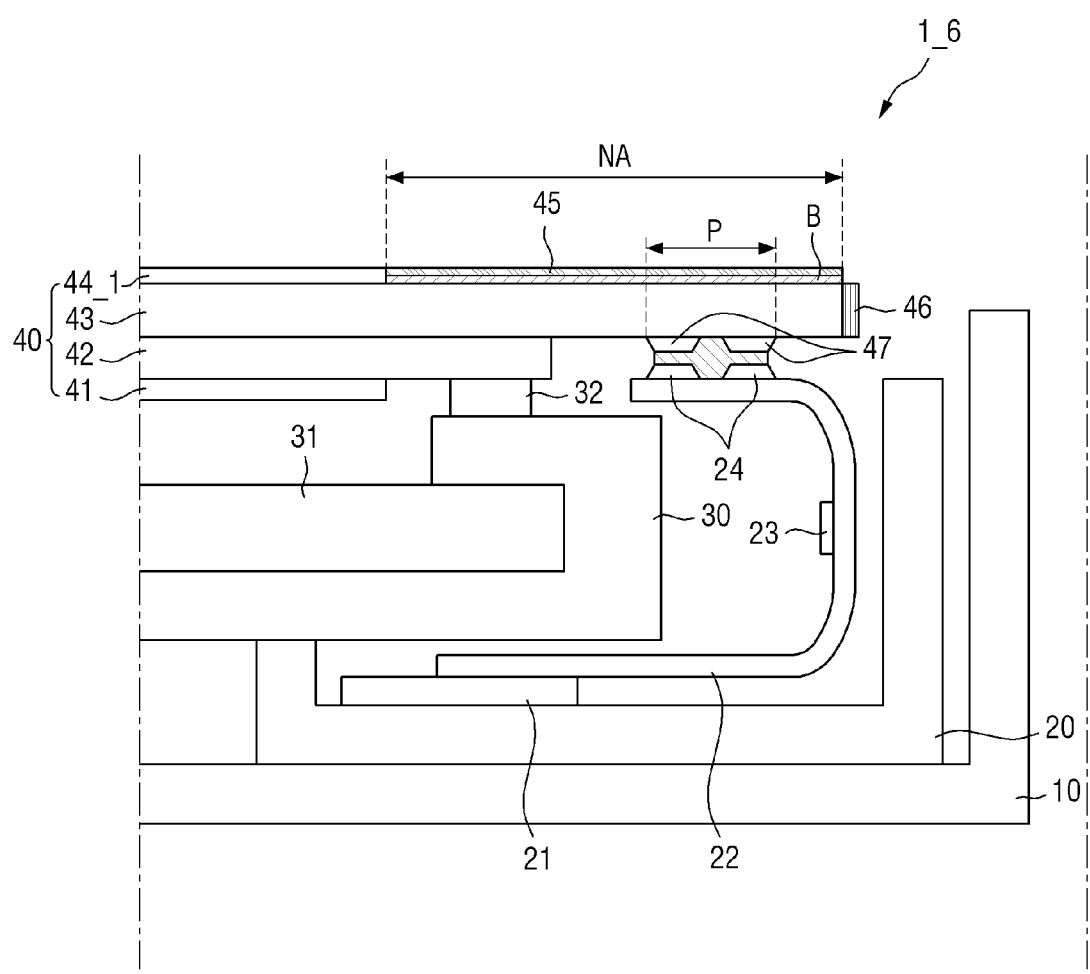
FIGS. 9, 10, 11, and 12 are cross-sectional views of display devices according to other embodiments.

Referring to FIG. 9, a second polarizing unit 44_1 and a protective film 45 may be disposed on the first substrate 43. The protective film 45 may be disposed in only a non-display area NA on a light-blocking pattern B, and the second polarizing unit 44_1 may be disposed in only a display area DA, and not in the non-display area where the protective film 45 is disposed.

The protective film 45 may contain glass or an organic material. In an exemplary embodiment, the protective film 45 may be formed into a single layer or a multilayer containing reinforced glass, polyurethane, polyimide, polyethyleneterephthalate, polycarbonate, or polymethylmethacrylate (PMMA), and may further include a hard coating layer, an anti-finger (AF) coating layer, an anti-reflection (AR) coating layer, or an anti-glare (AG) coating layer. However, the embodiments are not limited thereto.

The light-blocking pattern B may be protected by the protective film 45 such that this light-blocking pattern B is not damaged by foreign matter or external force, and the second polarizing unit 44_1 may be disposed in only an area corresponding to the display area DA, thereby reducing the cost for a polarizing unit.

Figure 10:
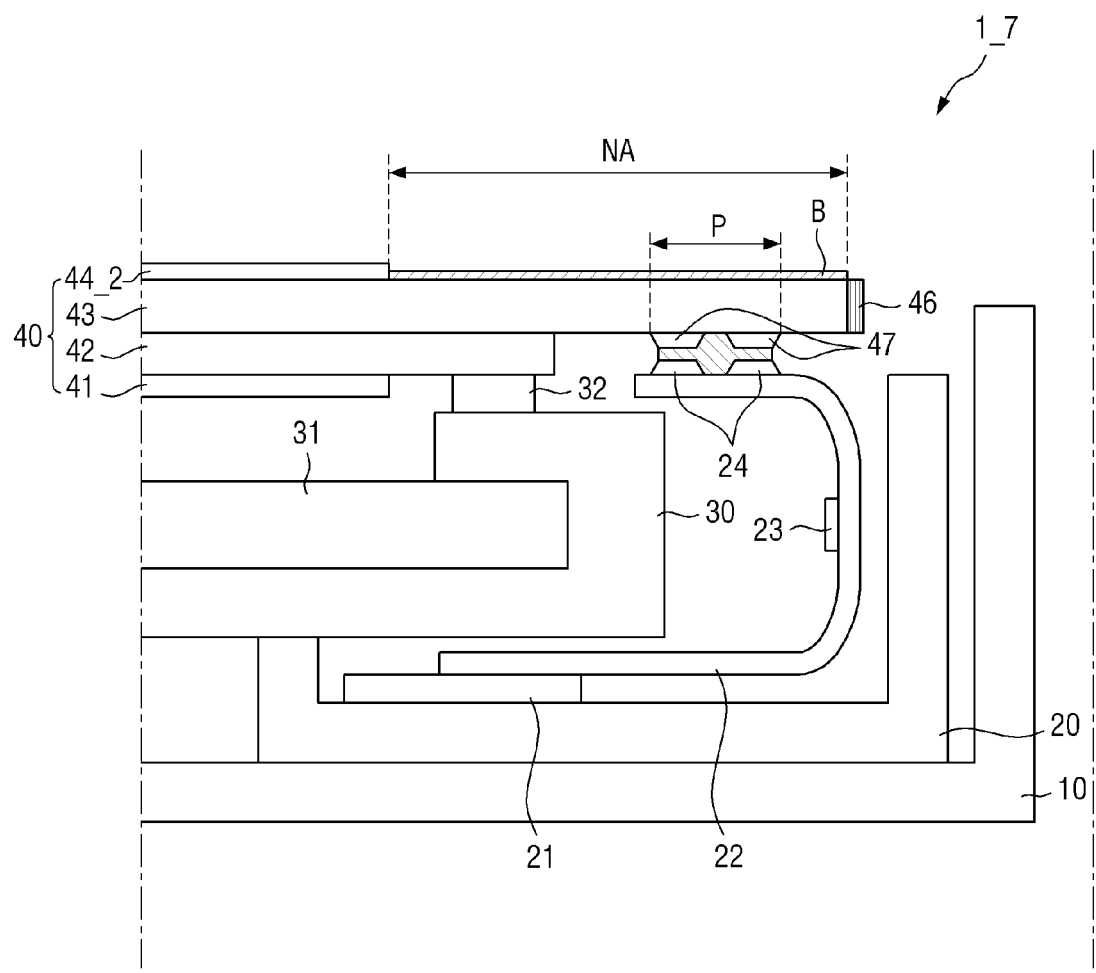

Referring to FIG. 10, a second polarizing unit 44_2 may be disposed in only a display area DA and not in a non-display area NA where a light-blocking pattern B is formed.

The second polarizing unit 44_2 is disposed in only an area corresponding to the display area DA, thereby reducing the cost for a polarizing unit, as described above.

Figure 11:
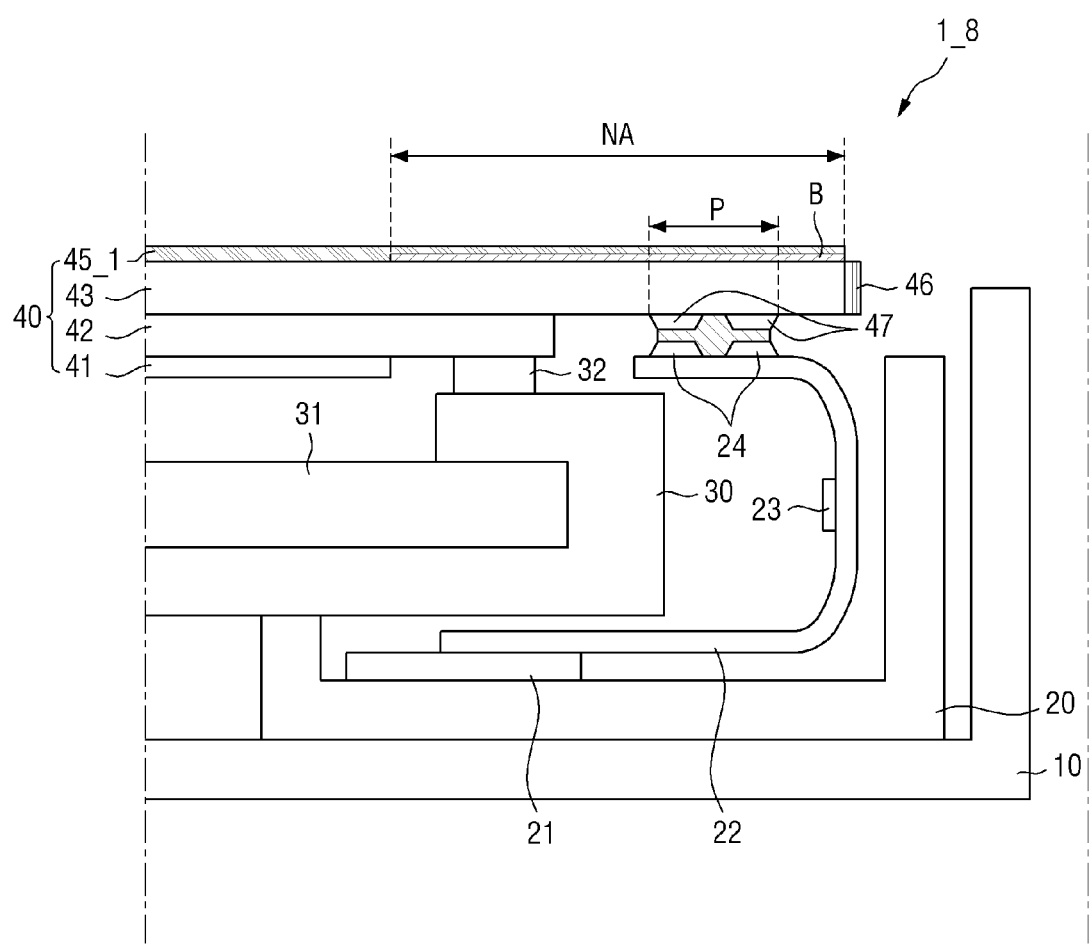

Referring to FIG. 11, a protective film 45_1, instead of the second polarizing unit 44, is disposed on the first substrate 43. The protective film 45_1 may be disposed to cover the entire area of the upper surface of the first substrate 43, including the display area DA and the anon-display area NA where the light-blocking pattern B is formed.

The protective film 45_1 may include the material or layers exemplified in the description of FIG. 9.

The second polarizing unit may also be disposed in the first substrate 43 in the form of a wire grid or the like.

The protective film 45_1, instead of the second polarizing unit 44, is disposed on the uppermost portion of the display device 1_8, thereby preventing the second polarizing unit 44 from being damaged by external force while protecting the light-blocking pattern B.

Figure 12:
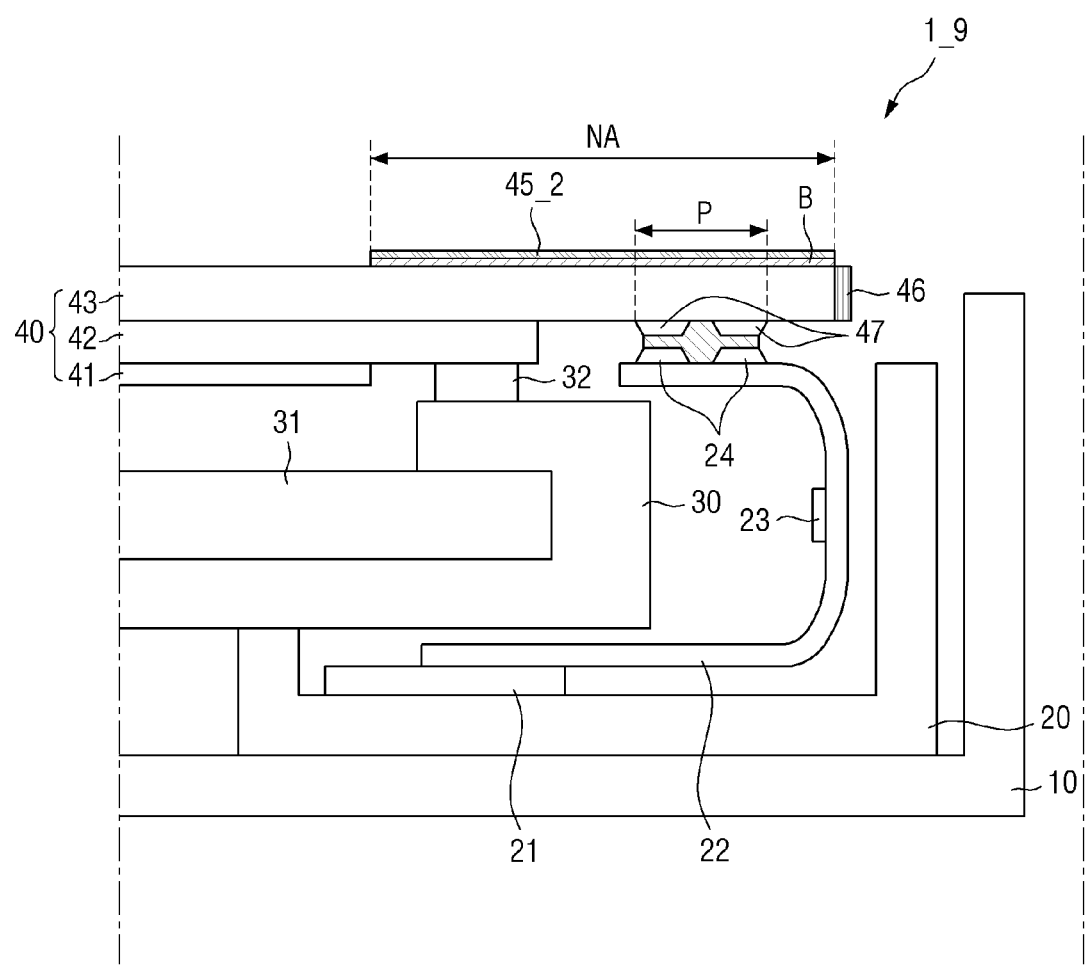

Referring to FIG. 12, similarly to the display device 1_6 of FIG. 9, a protective film 45_2, instead of the second polarizing unit 44, is disposed on the first substrate 43, but the protective film 45_2 may be disposed to cover only a non-display area NA where a light-blocking pattern B is formed.

The protective film 45_2 is disposed to cover only the non-display area NA where the light-blocking pattern B is formed, thereby reducing the cost for the protective film 45_2.

As described above, the second polarizing unit may also be disposed in the first substrate 43 in the form of a wire grid or the like.

Figure 13:
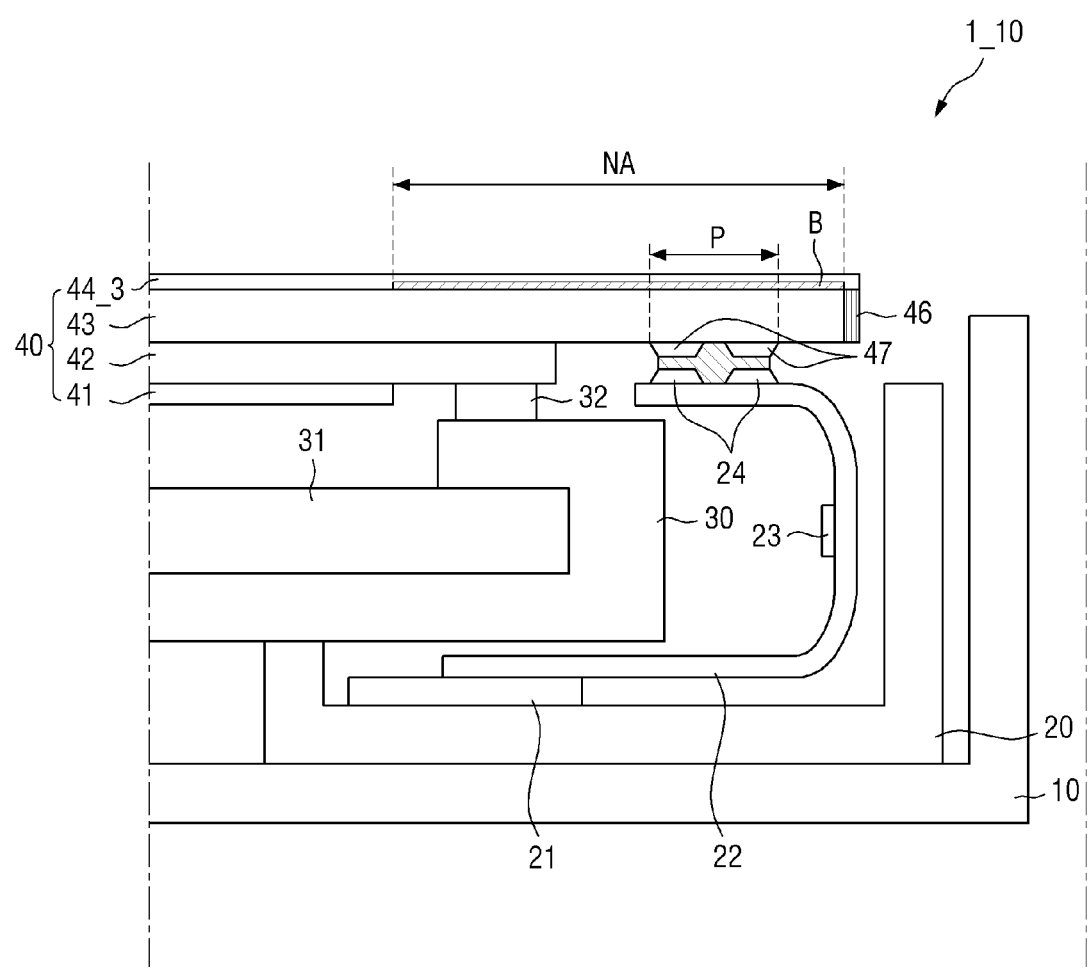
FIGS. 13, 14, 15, and 16 are cross-sectional views of display devices according to other embodiments.

FIG. 13 is a cross-sectional view of a display device 1_10 according to another embodiment.

The display device 1_10 of FIG. 13 is the same as the display device 1 having been described with reference to FIGS. 1 and 2, except that one side of a second polarizing unit 44_3 protrudes compared to one side of the first substrate 43. Hereinafter, a duplicated description will be omitted, and differences will be mainly described.

Referring to FIG. 13, one side of the second polarizing unit 44_3 may protrude compared to one side of the first substrate 43. One side of the second polarizing unit 44_3 may protrude so as to cover a part of the upper surface of the bumper 46 disposed on the lateral side of the first substrate 43 or the entire upper surface thereof.

The bumper 46 and the second polarizing unit 44_3 may be disposed such that the ends of the bumper 46 and the second polarizing unit 44_3 are matched with each other to allow the lateral sides thereof to be located on the same plane with each other. Thus, it is possible to prevent the bumper 46 from being detached by external force.

Figure 14:
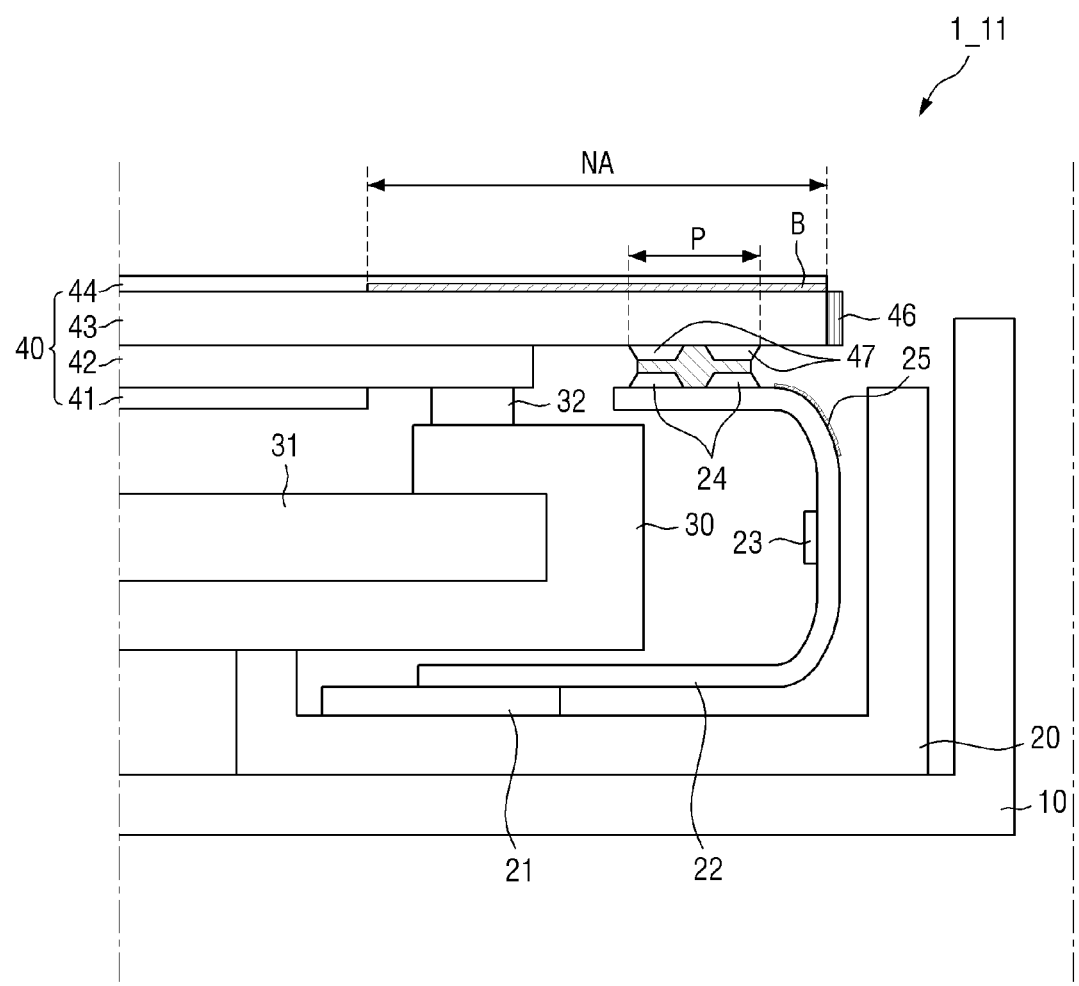

FIG. 14 is a cross-sectional view of a display device 1_11 according to another embodiment.

The display device 1_11 of FIG. 14 is the same as the display device 1 having been described with reference to FIGS. 1 and 2, except that a light-blocking pattern 25 is disposed on the flexible printed circuit board 22. Hereinafter, a duplicated description will be omitted, and differences will be mainly described.

Referring to FIG. 14, the third light-blocking pattern 25 is disposed on a part of the flexible printed circuit board 22. The third light-blocking pattern 25 may be disposed on the surface of the flexible printed circuit board 22, the surface facing the outside of the display device 1_11.

Since the display device 1_11 having a narrow bezel may not include a top cover or chassis for covering a part of the upper surface of the display device 1_11, the flexible printed circuit board 22 in the display device 1_11 may be externally viewed through a gap formed among the first substrate 43, the rear cover 10 and the auxiliary cover 20.

Therefore, it is possible to prevent the internal components (including the flexible printed circuit board 22) of the display device 1_11 from being viewed from the outside through the third light-blocking pattern 25 disposed on a part of the surface of the flexible printed circuit board 22, the surface facing the outside of the display device 1_11. The third light-blocking pattern 25 may be disposed to completely cover an area where the flexible printed circuit board 22 can be viewed from the outside.

The third light-blocking pattern 25 may contain a material for blocking light having a specific wavelength range by absorbing or reflecting the light.

In an exemplary embodiment, the third light-blocking pattern 25 may contain the material contained in the light-blocking pattern B in the description of FIG. 2, or may contain the material contained in the second light-blocking pattern B2 in the description of FIG. 3. However, the embodiments are not limited thereto, and the third light-blocking pattern 25 may be a layer coated with an organic material having a color substantially blocking red, blue or black visible light.

The third light-blocking pattern 25 may contain a material having substantially the same color as the light-blocking pattern B disposed on the first substrate 43. In an exemplary embodiment, the light-blocking pattern B disposed on the first substrate 43 may contain a material discolored black, and the third light-blocking pattern 25 disposed on the flexible printed circuit board 22 may contain black ink or a material discolored black.

Figure 15:
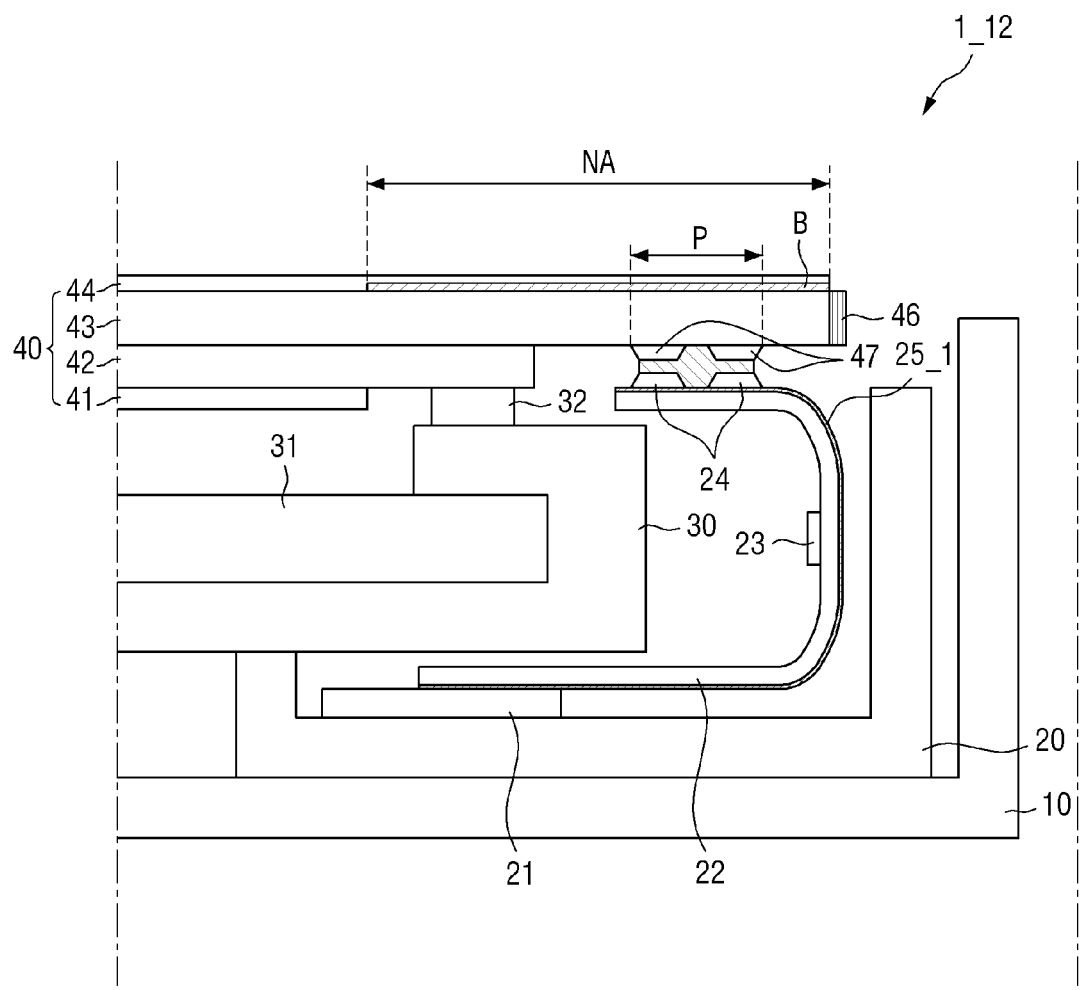

FIG. 15 is a cross-sectional view of a display device 1_12 according to another embodiment.

The display device 1_12 of FIG. 15 is the same as the display device 1_11 having been described with reference to FIG. 14, except that a third light-blocking pattern 25_1 is disposed to completely cover one side of the flexible printed circuit board 22. Hereinafter, a duplicated description will be omitted, and differences will be mainly described.

Referring to FIG. 15, the third light-blocking pattern 25_1 may be disposed to completely cover the surface of the flexible printed circuit board 22, the surface facing toward the outside of the display device 1_12.

As described above, the third light-blocking pattern 25_1 may contain a material for blocking light having a specific wavelength range by absorbing or reflecting the light, and may contain a material having substantially the same color as the light-blocking pattern B disposed on the first substrate 43.

Figure 16:
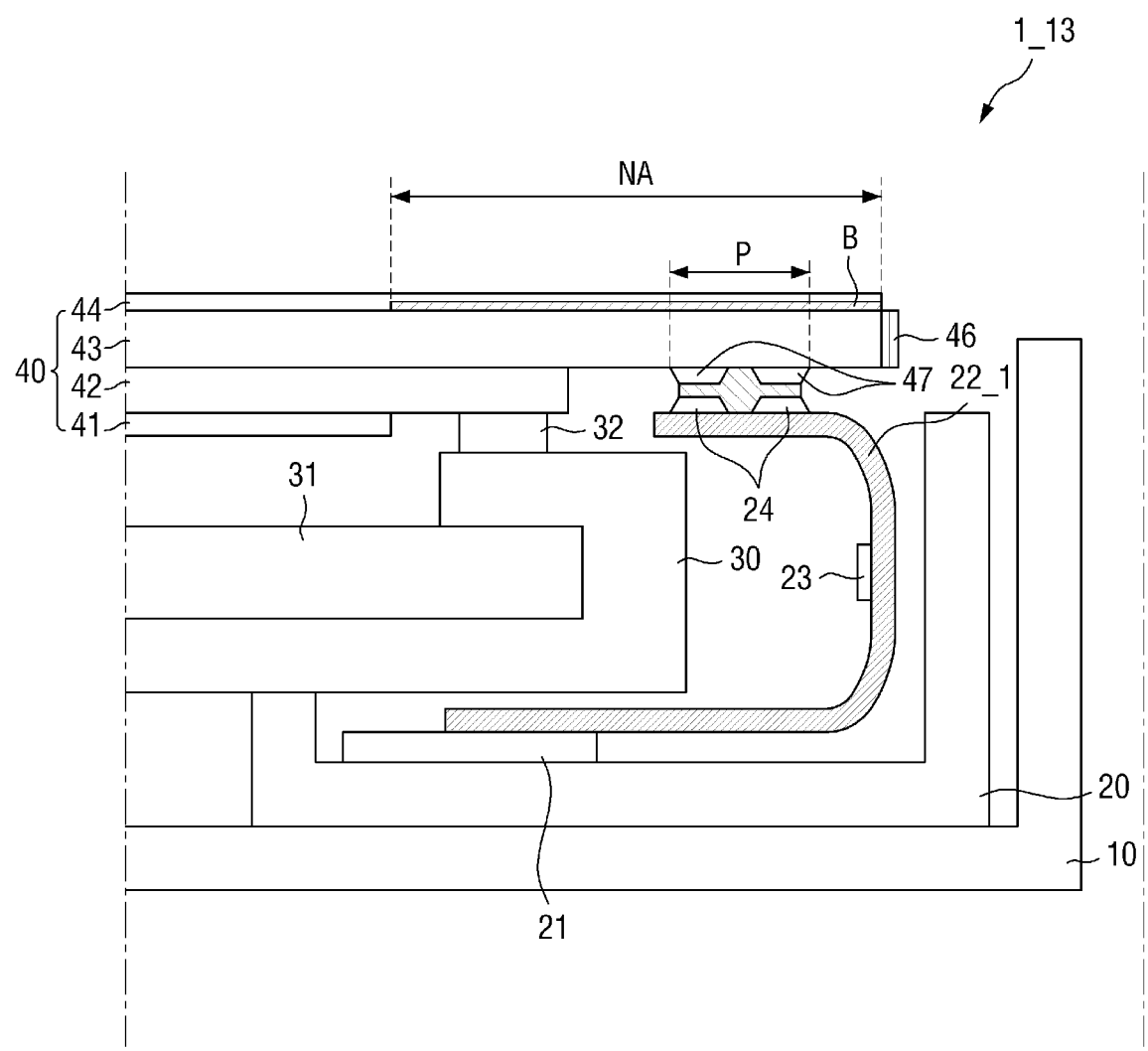

FIG. 16 is a cross-sectional view of a display device 1_13 according to another embodiment.

The display device 1_13 of FIG. 16 is the same as the display device 1_11 having been described with reference to FIG. 14, except that the third light-blocking pattern 25 is omitted, and a light-blocking material is contained in a flexible printed circuit board 22_1. Hereinafter, a duplicated description will be omitted, and differences will be mainly described.

Referring to FIG. 16, a material for blocking light having a specific wavelength range by absorbing or reflecting the light may be contained in the flexible printed circuit board 22_1. Specifically, at least one layer made of the light-blocking material may be provided in the flexible printed circuit board 22_1, or the entire flexible printed circuit board 22_1 may be made of the light-blocking material.

In an exemplary embodiment, the flexible printed circuit board 22_1 may be made of a material having a color substantially blocking red, blue or black visible light. However, the embodiments are not limited thereto, and the flexible printed circuit board 22_1 may contain the material contained in the light-blocking pattern B in the description of FIG. 2, or may contain the material contained in the second light-blocking pattern B2 in the description of FIG. 3.

As described above, the light-blocking material contained in the flexible printed circuit board 22_1 may have substantially the same color as the light-blocking pattern B disposed on the first substrate 43.

FIGS. 17 to 24 are stepwise cross-sectional views of a method of manufacturing a display device according to an embodiment.

Figure 17:
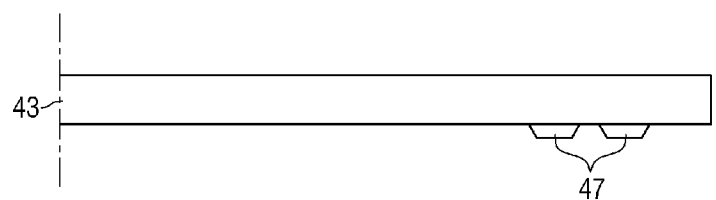
FIGS. 17, 18, 19, 20, 21, 22, 23, and 24 are stepwise cross-sectional views of a method of manufacturing a display device according to an embodiment.

Referring to FIG. 17, first, a substrate 43 including a thin film transistor is provided. Since it is obvious from the technology well known in the art that the thin film transistor is fabricated by forming a gate wiring, an active layer, and a data wiring on a base substrate, a detailed description thereof will be omitted.

The first substrate 43 is overturned such that the rear surface thereof, on which the base substrate is disposed, faces upward, and then subsequent processes may proceed. A pad 47 connected with the ends of a gate wiring and/or a data wiring extending to a non-display area NA may be formed beneath the first substrate 43.

Figure 18:
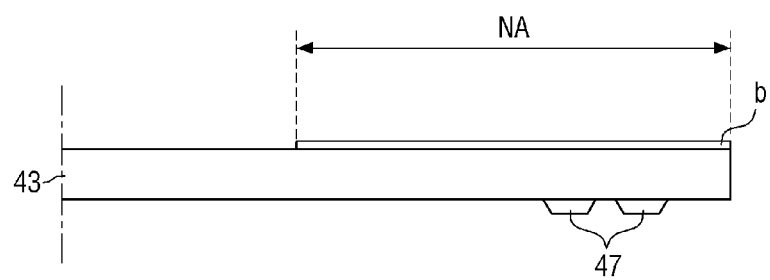

Referring to FIG. 18, subsequently, a light-transmitting pattern b is formed on the first substrate 43.

The light-transmitting pattern b may be formed on the same area as the planar non-display area NA on the first substrate 43. The light-transmitting pattern b may be formed to cover the pad 47 formed beneath the first substrate 43.

The light-transmitting pattern b may contain a discoloring material. The discoloring material has been described as above with reference to FIG. 2.

Hereinafter, there will be exemplified a case of forming the light-transmitting pattern b containing a material, which is transparent to visible light before ultraviolet (UV) irradiation and is irreversibly changed into a color substantially blocking visible light when ultraviolet light is applied, as the discoloring material.

In an exemplary embodiment, the discoloring material may contain a photosensitive material and a photoinitiator. Specific examples of the photosensitive material and the photoinitiator are the same as those in the description of FIG. 2.

The light-transmitting pattern b may be formed by applying the discoloring material to the non-display area NA on the first substrate 43.

Since the discoloring material contained in the light-transmitting pattern b is not irradiated with ultraviolet light, this discoloring material may be transparent.

Figure 19:
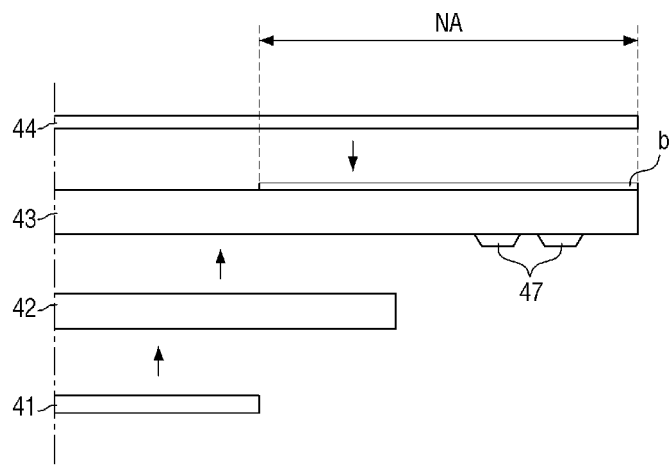

Referring to FIG. 19, subsequently, a first polarizing unit 41 is formed under the first substrate 43, and a second polarizing unit 44 is formed over the first substrate 43.

The second polarizing unit 44 may be formed after forming the first polarizing unit 41, and the first polarizing unit 41 may also be formed after forming the second polarizing unit 44.

A second substrate 42 facing the first substrate 43 may be previously formed between the first substrate 43 and the first polarizing unit 41. The second substrate 42 may include a common electrode, a color filter, and the like, and may be disposed to be spaced apart from an area where the pad 47 beneath the first substrate 43 is connected with the flexible printed circuit board 22. Although not shown in the drawings, a liquid crystal layer and a sealing material surrounding the lateral side of the liquid crystal layer to seal the liquid crystal layer may be formed between the first substrate 43 and the second substrate 42.

The second polarizing unit 44 may be disposed to cover the entire area of the upper surface of the first substrate 43, the entire area including an area where the light-transmitting pattern b is formed. When the light-transmitting pattern b is formed by thinly applying the discoloring material, it is possible to prevent the level difference from being generated between an area where the second polarizing unit 44 covers the first substrate 43 and an area where the second polarizing unit 44 covers the light-transmitting pattern b.

In the drawings, a process of attaching the second substrate 42 to the lower surface of the first substrate 43 after forming the light-transmitting pattern b is shown, but a process of forming the light-transmitting pattern b after attaching the second substrate 42 to the lower surface of the first substrate 43 may be performed. Specifically, when irradiation with ultraviolet light or the like, which can discolor the light-transmitting pattern b, is not accompanied in the process of forming the second substrate 42 and attaching this second substrate 42 to the first substrate 43, the process of attaching the second substrate 42 to the first substrate 43 after forming the light-transmitting pattern b may be performed. However, the embodiments are not limited thereto.

Figure 20:
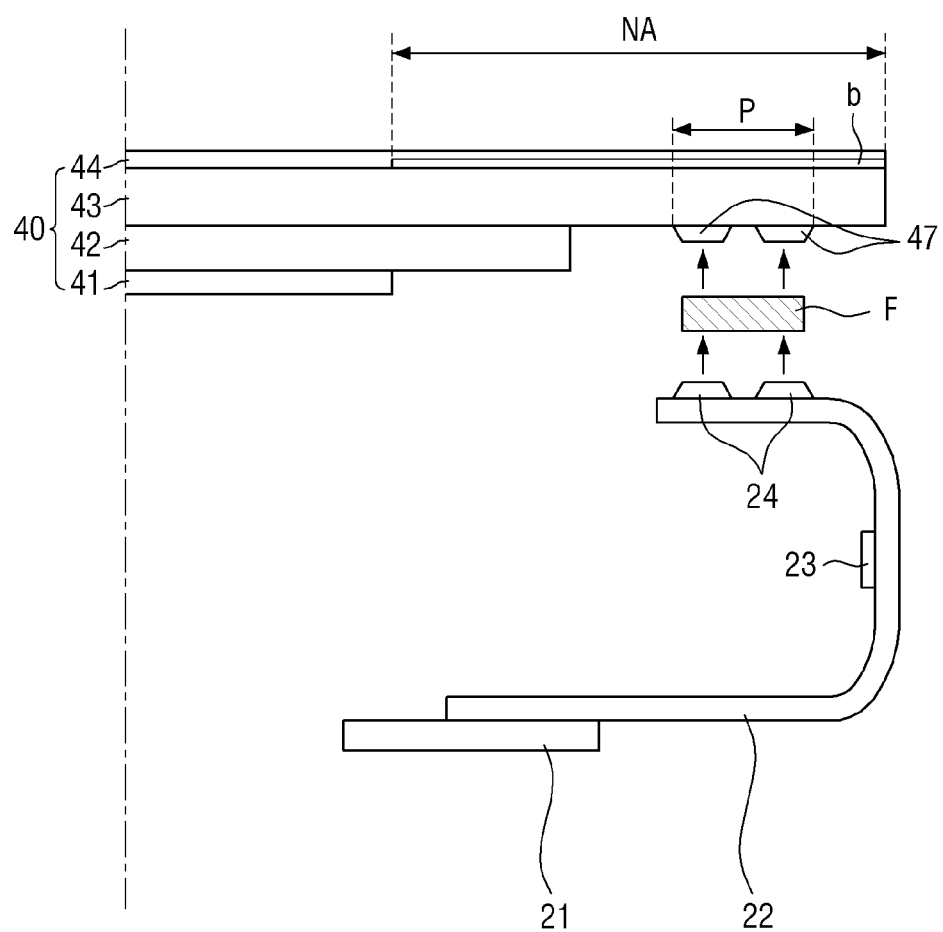

Referring to FIG. 20, subsequently, a bump 24 disposed on a flexible printed circuit board 22 is connected with a pad 47 disposed beneath the first substrate 43.

The pad 47 is connected with the bump 24 by thermal pressing. The flexible printed circuit board 22, one portion thereof be connected with the pad 47 through the bump 24, may be bent inward to connect the other portion thereof with a printed circuit board 21.

A third light-blocking pattern 25 may be formed on the surface of the flexible printed circuit board 22, the surface facing the outside of a display device. The third light-blocking pattern 25 has been described as above with reference to FIGS. 13 to 15.

Hereinafter, a case of disposing an anisotropic conductive film F between the pad 47 and the bump 24 and then connecting the pad 47 with the bump 24 by using OLB-type thermal pressing will be exemplified.

Figure 21:
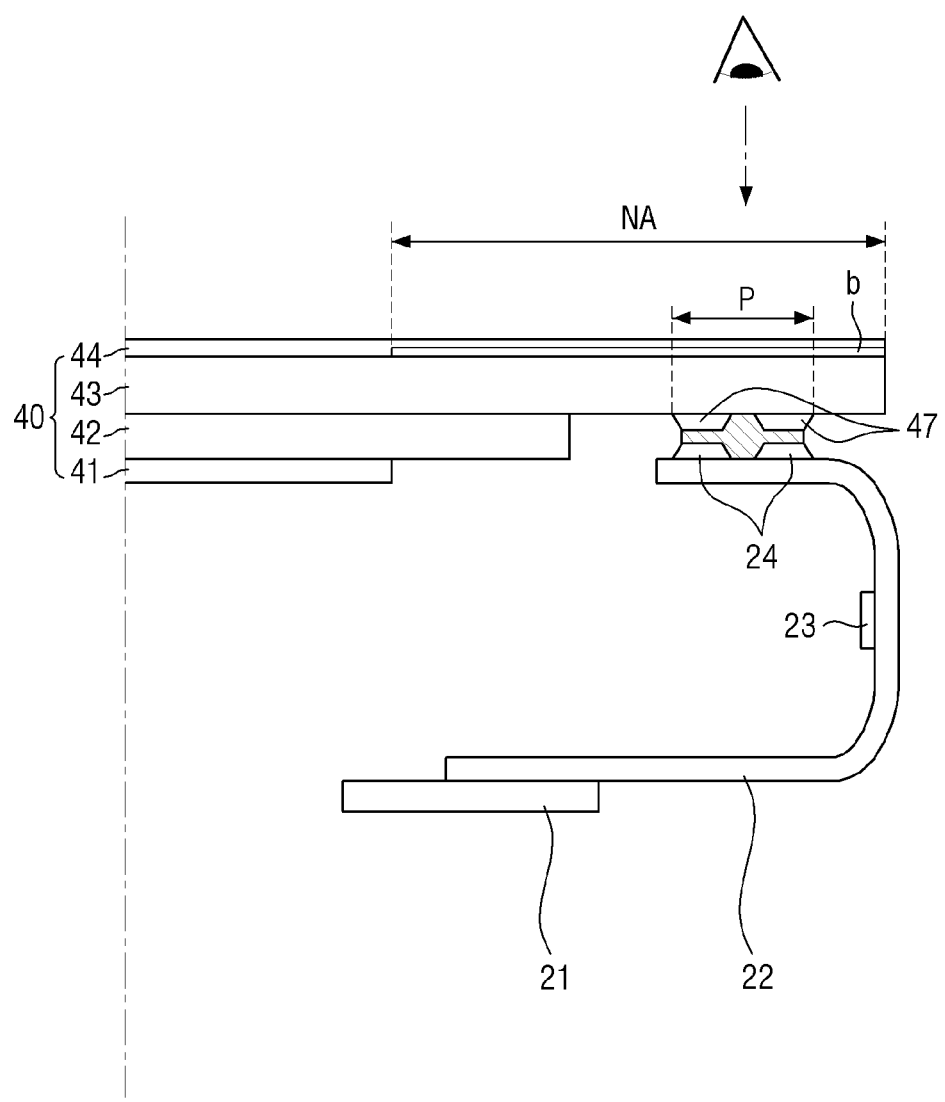

Referring to FIG. 21, subsequently, specific portions inside and outside the display device, the specific portions being included in a target checking portion P, are checked or inspected through the light-transmitting pattern b.

Hereinafter, a case that the target checking portion P is a portion where the pad 47 and the bump 24 are connected with each other will be exemplified.

When the pad 47 and the bump 24 are pressed by OLB type pressing, some of conductive particles contained in the anisotropic conductive film F may be formed into indent marks which can be checked even from the opposite surface of the first substrate 43. A portion where the pad 47 and the bump 24 are connected with each other may include the indent marks.

The shape, number, strength, length and distribution of the indent marks formed from the upper portion of the first substrate 43 to the upper surface of the first substrate 43 may be inspected through the light-transmitting pattern b disposed to cover the portion where the pad 47 and the bump 24 are connected with each other.

Since the light-transmitting pattern b is transparent to visible light, the inspection may be performed with naked eyes. However, the embodiments are not limited thereto. When the inspection can be performed by infrared light, the light-transmitting pattern b may be made of a discoloring material transmitting infrared light, and when the inspection can be performed by ultraviolet light, the light-transmitting pattern b may be made of a discoloring material transmitting ultraviolet light. That is, the discoloring material may be suitably selected according to an inspection method.

Figure 22:
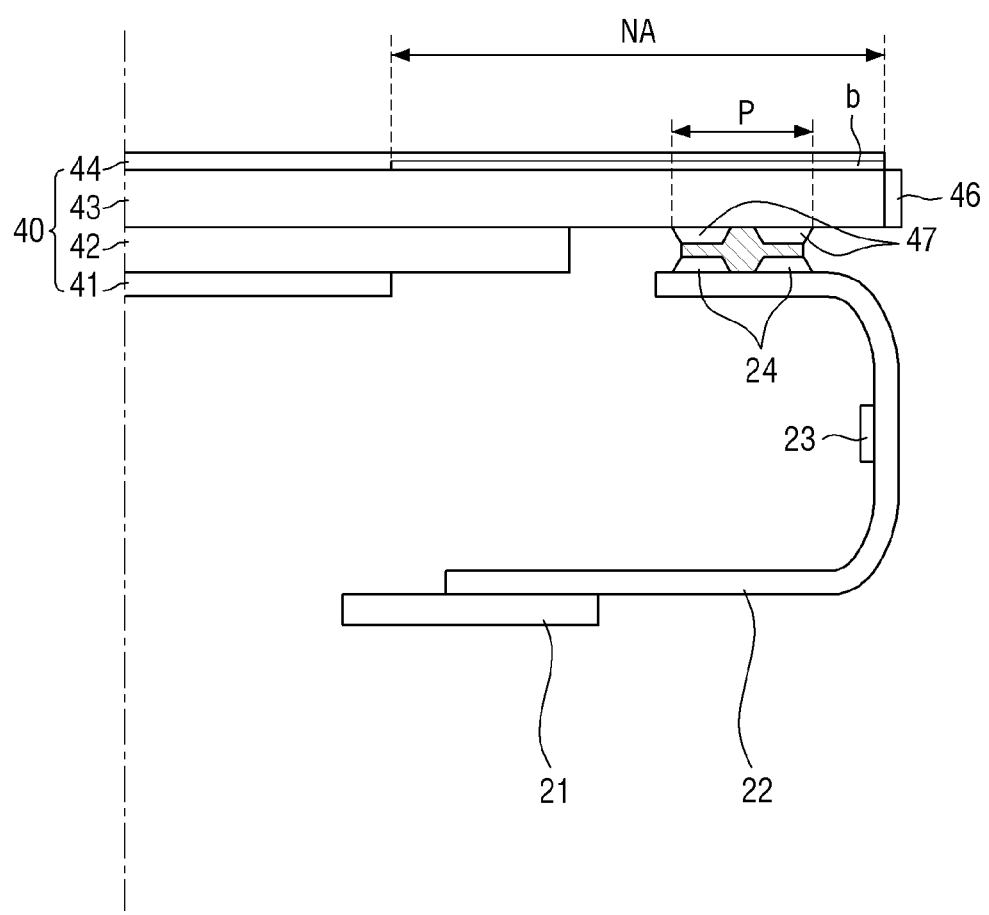

Referring to FIG. 22, a bumper 46 is formed to cover the lateral side of the first substrate 43.

The material, color and the like of the bumper 46 have been described as above with reference to FIG. 2.

In an exemplary embodiment, a resin that can be cured by ultraviolet light is applied to the lateral side of the first substrate 43, and then the resin is irradiated with ultraviolet light to cure the resin, thereby forming the bumper 46.

Figure 23:
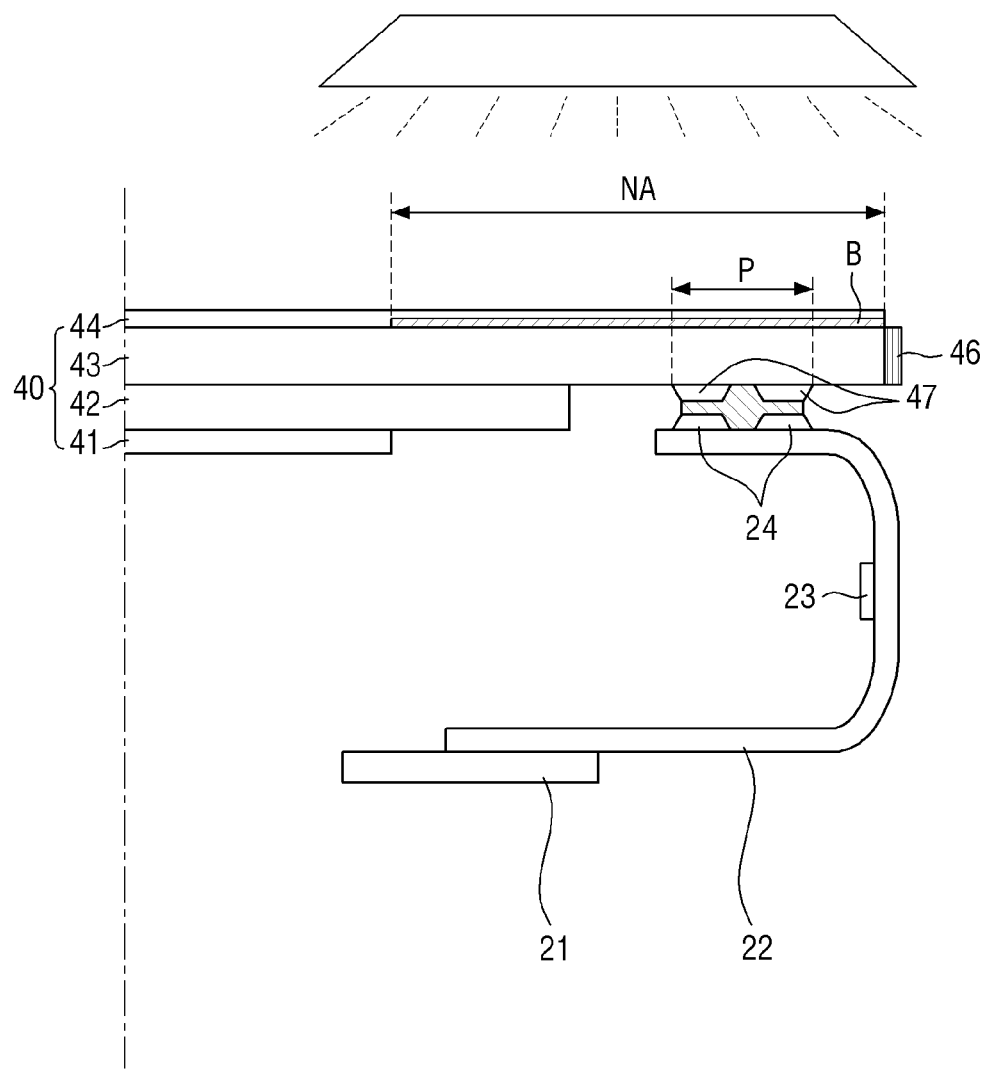

Referring to FIG. 23, subsequently, the light-transmitting pattern b is irradiated with ultraviolet light to discolor the light-transmitting pattern b, thereby forming a light-blocking pattern B.

The discoloring material contained in the light-blocking pattern b may have a color which is changed by ultraviolet light to substantially block visible light. Therefore, the target checking portion P, such as a thin film transistor wiring provided under an area where the light-blocking pattern B is disposed, or indent marks, may not be viewed from the outside.

Ultraviolet light may be applied to the upper surface of the first substrate 43 provided with the light-transmitting pattern b. Ultraviolet light may be applied to the entire upper surface of a display device, and may also be applied to only an area where the light-transmitting pattern b is disposed.

When a resin, which can be cured by ultraviolet light, is applied to the lateral side of the first substrate 43, the timing of irradiating the resin with ultraviolet light may be the same as the timing of irradiating the light-transmitting pattern b with ultraviolet light. When the light-transmitting pattern b is irradiated with ultraviolet light, an area coated with the resin is also irradiated with ultraviolet, thereby simultaneously performing a process of discoloring the light-transmitting pattern b and a process of forming the bumper 46 without additional equipment.

When a third light-blocking pattern 25 is formed on the flexible printed circuit board 22 by a material discolored by ultraviolet light, the third light-blocking pattern 25 is also irradiated with ultraviolet light, thereby discoloring the third light-blocking pattern 25.

Figure 24:
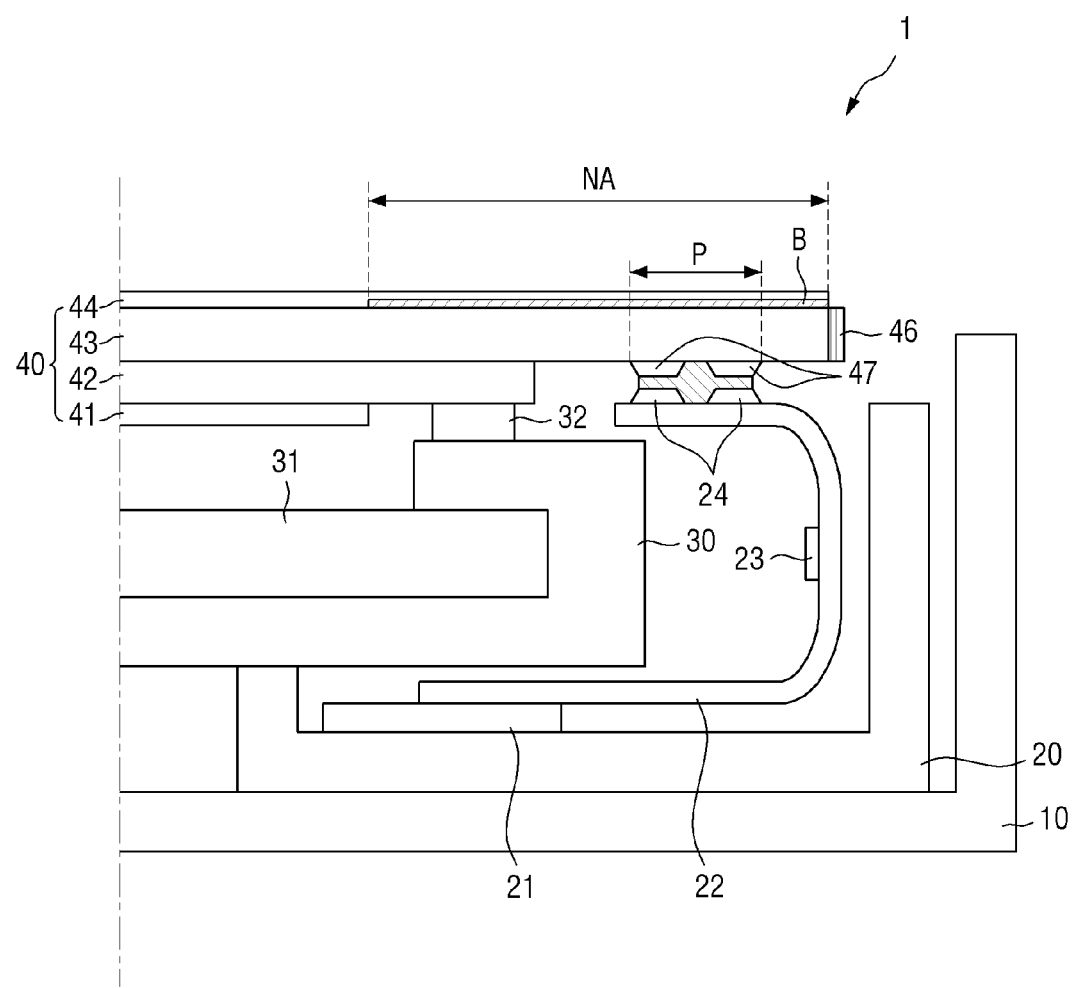

Referring to FIG. 24, subsequently, a backlight unit 31 and a mold 30 are provided, and components of a display device 1 are stored in an auxiliary cover 20 and a rear cover 10, thereby completing the process of manufacturing the display device 1.

As described above, according to embodiments, features are as follows.

It is possible to effectively prevent the light transmission to the non-display area of the display device through a light-blocking pattern.

Further, it is possible to reduce the defect rate of the display device by checking or inspecting the components provided under the display device through the light-blocking pattern containing a discoloring material discolored by a specific stimulus.

The features of the inventive concept are not limited by the foregoing, and other various features are anticipated herein.

While the inventive concept has been particularly illustrated and described with reference to exemplary embodiments thereof, it will be understood by those of ordinary skill in the art that various changes in form and detail may be made therein without departing from the spirit and scope of the inventive concept as defined by the following claims. The exemplary embodiments should be considered in a descriptive sense only and not for purposes of limitation.

What is claimed is:

1. A display device, comprising:
    a first substrate including a planar display area and a planar non-display area;
    a second substrate facing a first surface of the first substrate;
    a pad disposed directly on the first surface of the first substrate in the non-display area;
    a target checking portion disposed on the first surface of the first substrate in the non-display area and including at least a part of an area provided with the pad;
    a flexible printed circuit board provided with a bump connected with the pad;
    a light-blocking pattern disposed in the non-display area, the light-blocking pattern disposed directly on a second surface of the first substrate which is opposite to the first surface of the first substrate and comprising a discoloring material,
    wherein the pad and the bump do not overlap the second substrate in a direction perpendicular to the first surface of the first substrate, and
    wherein the pad and the bump fully overlap the light-blocking pattern.

2. The display device of claim 1,
    wherein the light-blocking pattern comprises a photosensitive material and a photoinitiator.

3. The display device of claim 2,
    wherein the photosensitive material comprises one or more selected from the group consisting of spiropyrans, spirooxazines, naphthopyrans, bismethyl phenyl diphenyl butatriene, trinitro fluorenone, and derivatives thereof.

4. The display device of claim 1, wherein the target checking portion further comprises a portion where the pad and the bump are connected with each other.

5. The display device of claim 4, wherein the portion where the pad and the bump are connected with each other comprises an indented manufacturing alignment mark.

6. The display device of claim 5,
wherein the light-blocking pattern comprises a photosensitive material and a photoinitiator.

7. The display device of claim 6,
wherein the photosensitive material comprises one or more selected from the group consisting of spiropyrans, spirooxazines, naphthopyrans, bismethyl phenyl diphenyl butatriene, trinitro fluorenone, and derivatives thereof.

8. The display device of claim 5, further comprising:
another light-blocking pattern disposed on one side of the flexible printed circuit board.

9. The display device of claim 8,
wherein the another light-blocking pattern comprises the discoloring material.

10. The display device of claim 1, further comprising:
a bumper disposed to cover at least one lateral side of the first substrate.

11. The display device of claim 10,
wherein the bumper comprises a resin cured by light irradiation.

* * * * *